(12) United States Patent
Takami et al.

(10) Patent No.: US 7,687,367 B2
(45) Date of Patent: Mar. 30, 2010

(54) MANUFACTURE METHOD FOR SEMICONDUCTOR DEVICE HAVING FIELD OXIDE FILM

(75) Inventors: Syuusei Takami, Yusui-Cho (JP); Hiroaki Fukami, Yusui-Cho (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/851,082

(22) Filed: Sep. 6, 2007

(65) Prior Publication Data

US 2008/0003776 A1    Jan. 3, 2008

Related U.S. Application Data

(62) Division of application No. 11/346,270, filed on Feb. 3, 2006, now abandoned.

(30) Foreign Application Priority Data

Feb. 4, 2005    (JP)    ............................. 2005-028699
Mar. 18, 2005   (JP)    ............................. 2005-078628

(51) Int. Cl.
    *H01L 21/76*    (2006.01)
(52) U.S. Cl. ...................................... 438/400
(58) Field of Classification Search .................. 438/400
    See application file for complete search history.

(56) References Cited

U.S. PATENT DOCUMENTS 6,232,648 B1    5/2001   Wu 6,933,192 B1    8/2005   Divakaruni et al.

FOREIGN PATENT DOCUMENTS

| JP | 60-180158   | 9/1985  |
|----|-------------|---------|
| JP | 63-133645   | 6/1988  |
| JP | 63-144543   | 6/1988  |
| JP | 03-220748   | 9/1991  |
| JP | 4-267335    | 9/1992  |
| JP | 05-129282   | 5/1993  |
| JP | 05-136123   | 6/1993  |
| JP | 06-005588   | 1/1994  |
| JP | 06-085053   | 3/1994  |
| JP | 7-321193    | 12/1995 |
| JP | 10-284479   | 10/1998 |
| JP | 2000-012789 | 1/2000  |

*Primary Examiner*—Kimberly D Nguyen
*Assistant Examiner*—Tony Tran
(74) *Attorney, Agent, or Firm*—Dickstein Shapiro LLP

(57) ABSTRACT

On the principal surface of a silicon substrate, a side spacer made of silicon nitride is formed on the side wall of a lamination including a silicon oxide film, a silicon nitride film and a silicon oxide film. Thereafter, a channel stopper ion doped region is formed by implanting impurity ions by using as a mask the lamination, side spacer and resist layer. After the resist layer and side spacer are removed, a field oxide film is formed through selective oxidation using the lamination as a mask, and a channel stopper region corresponding to the ion doped region is formed. After the lamination is removed, a circuit device such as a MOS type transistor is formed in each device opening of the field oxide film.

2 Claims, 18 Drawing Sheets

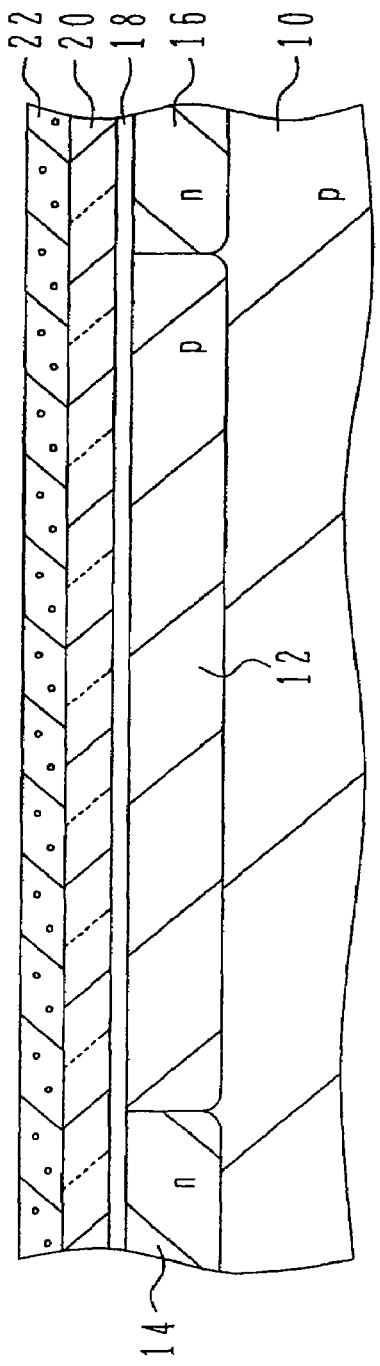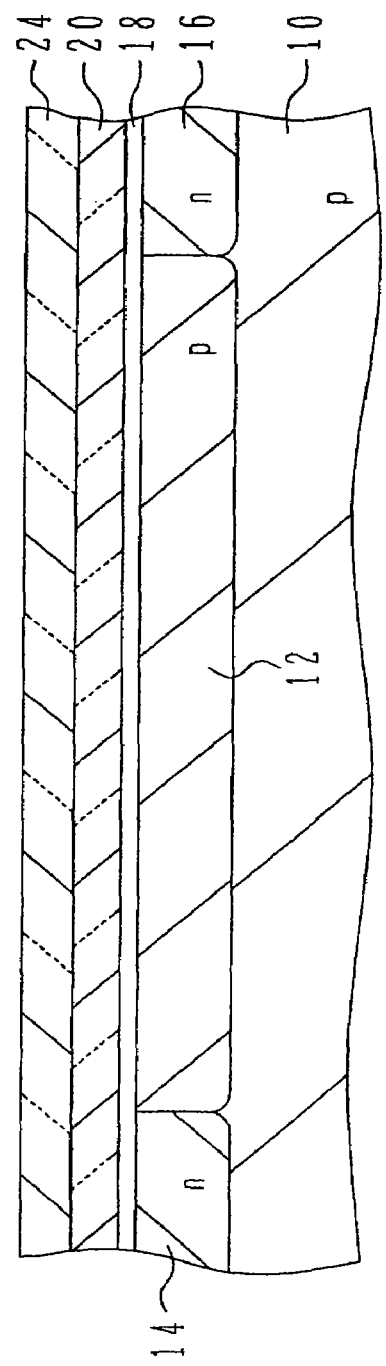
FIG.1A
FIG.1B

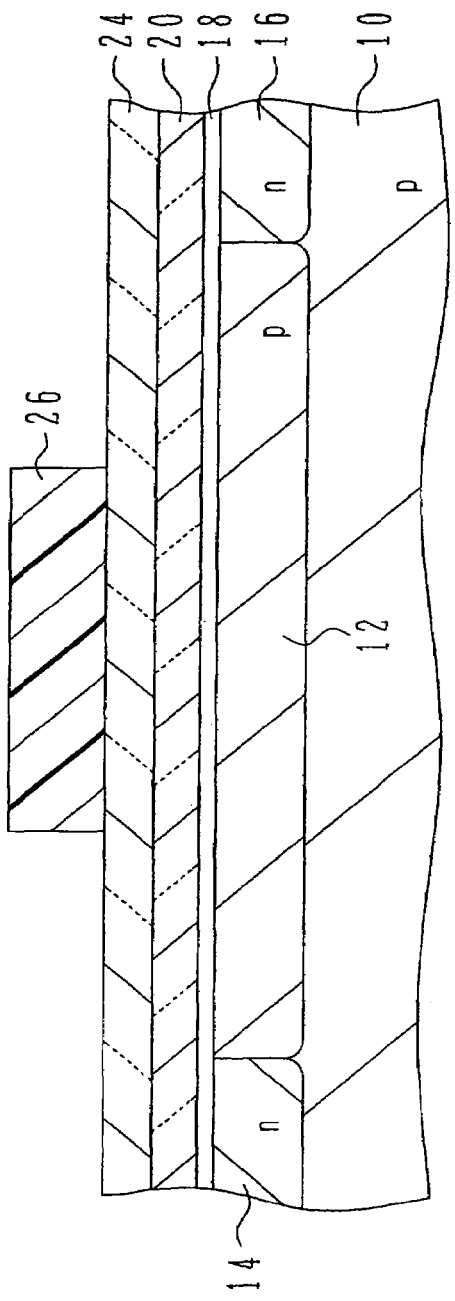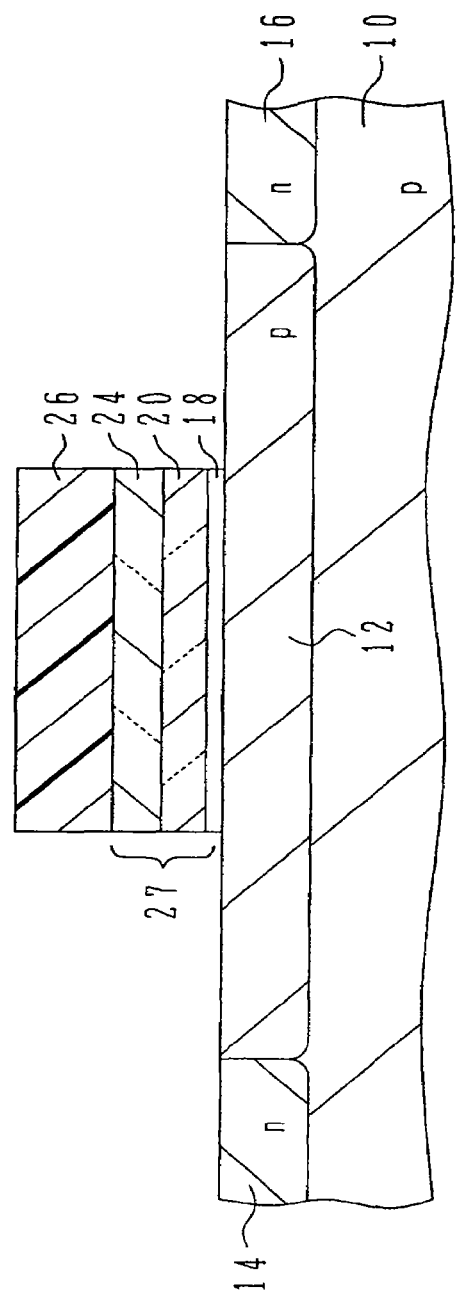

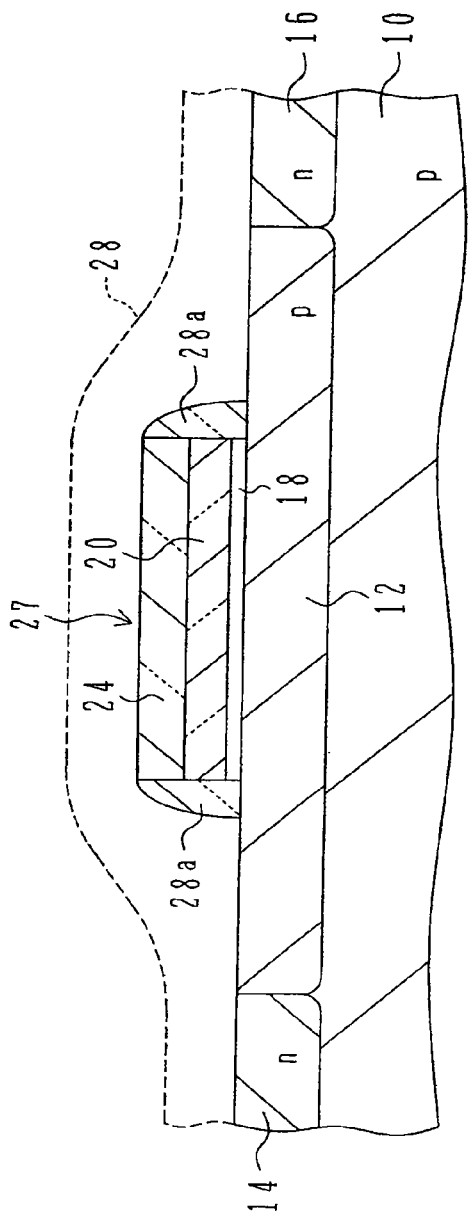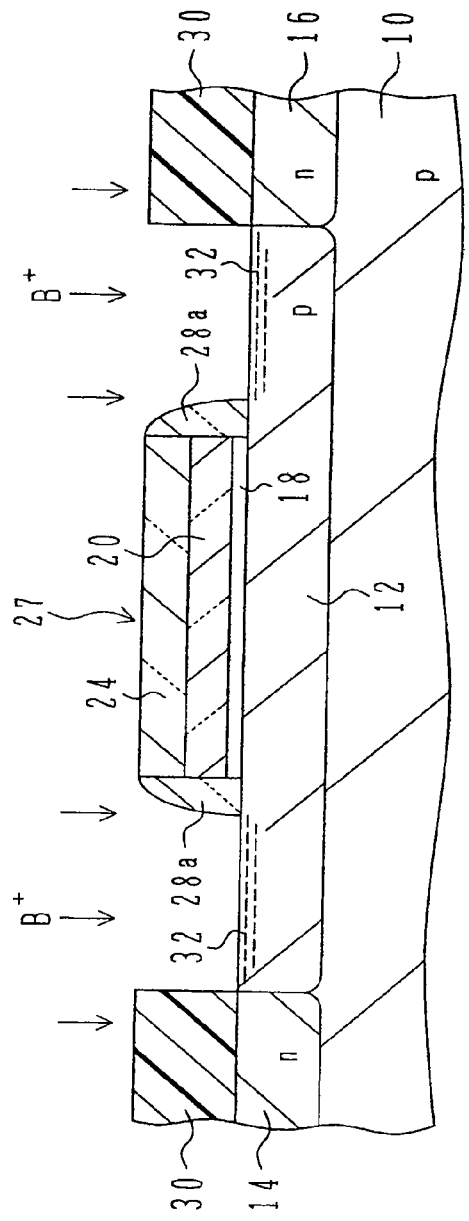

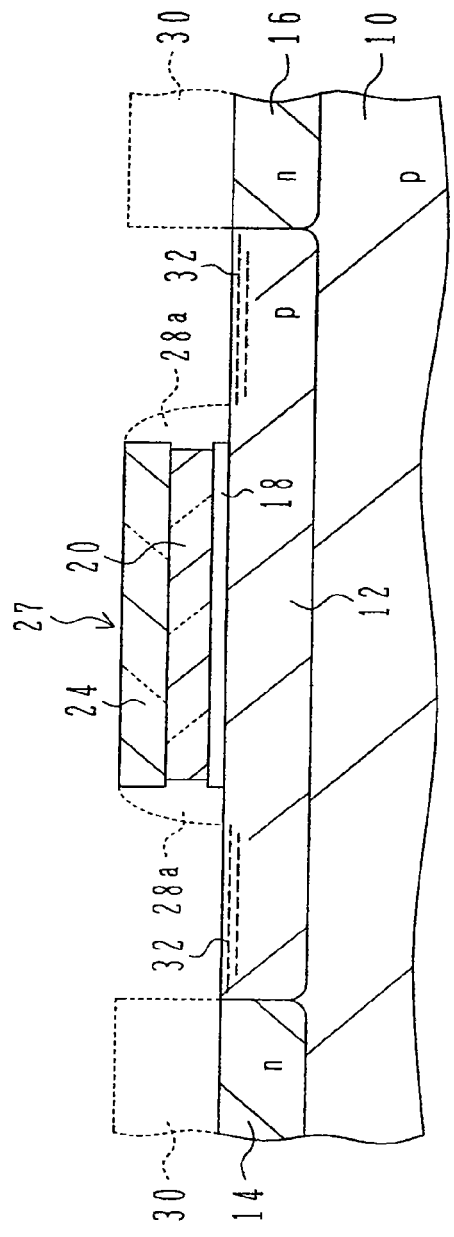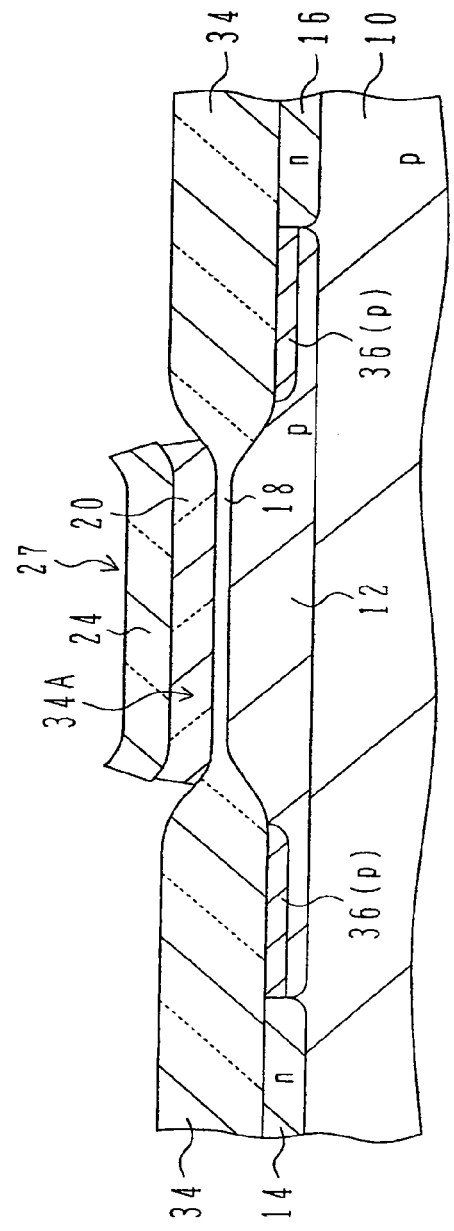

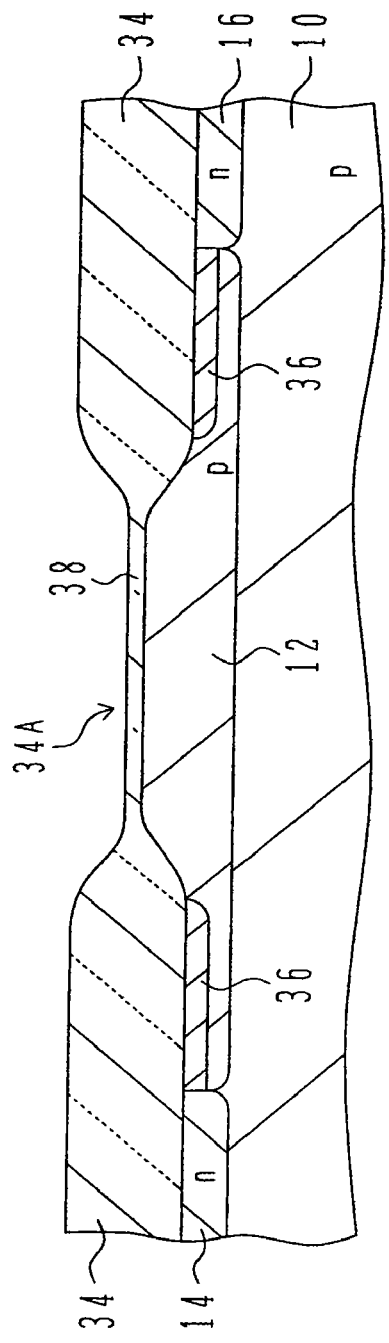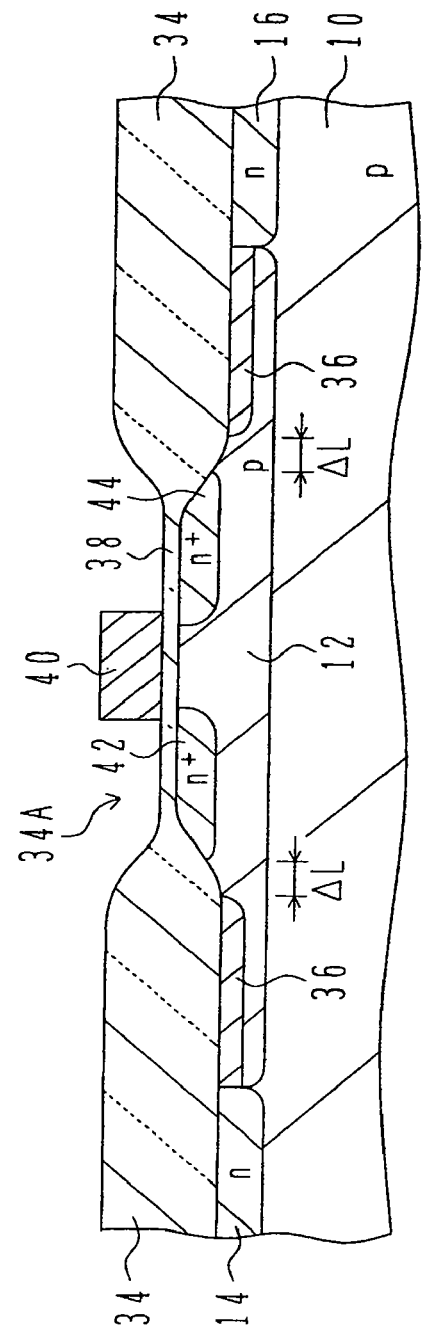

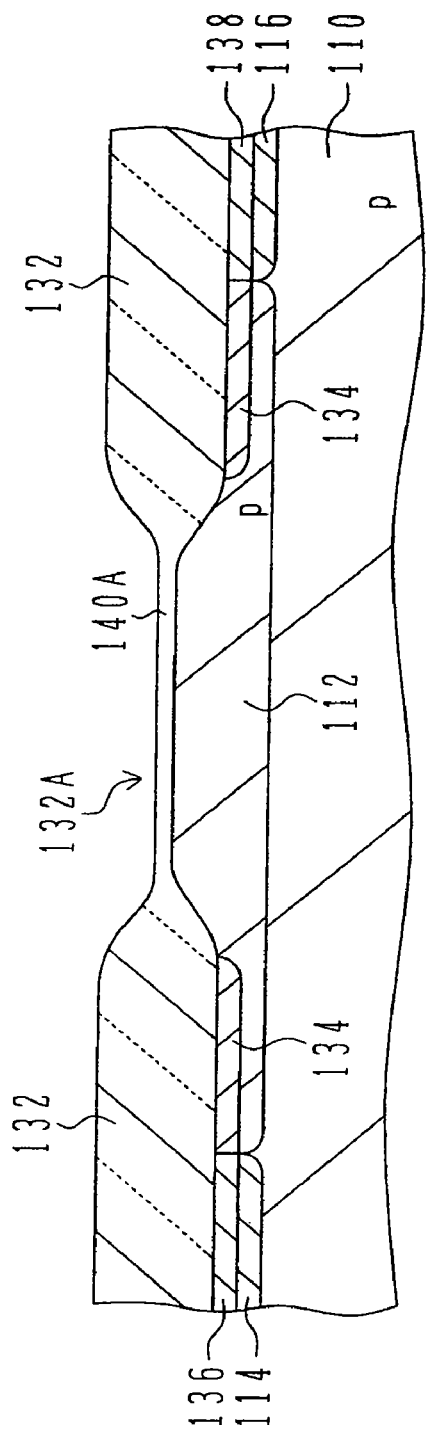
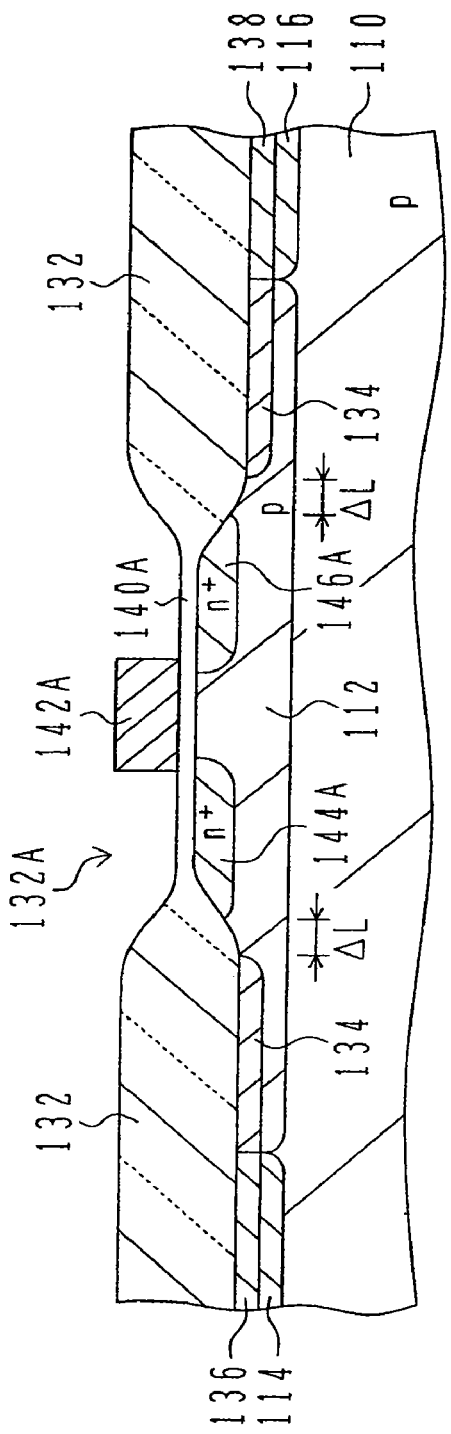

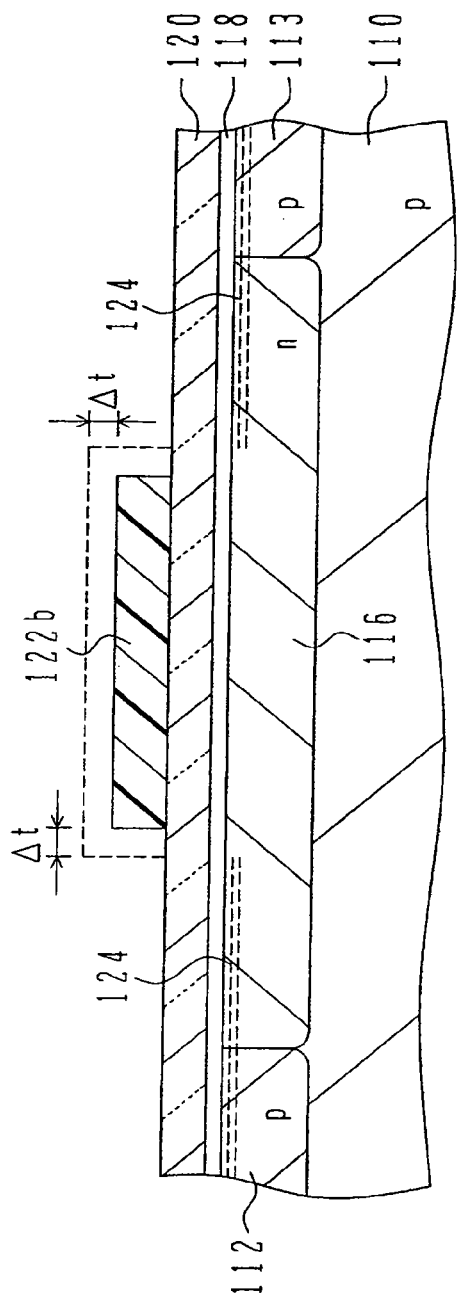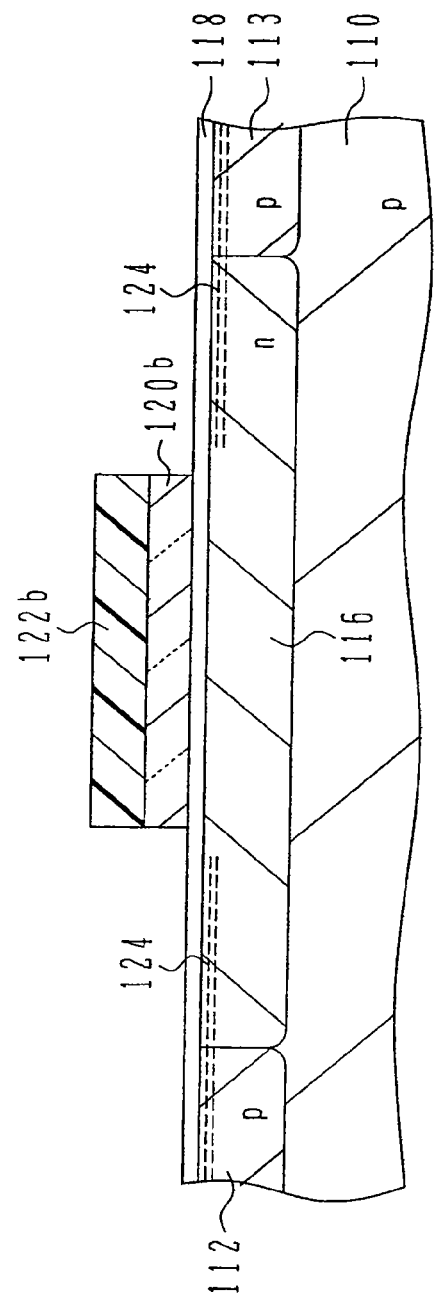

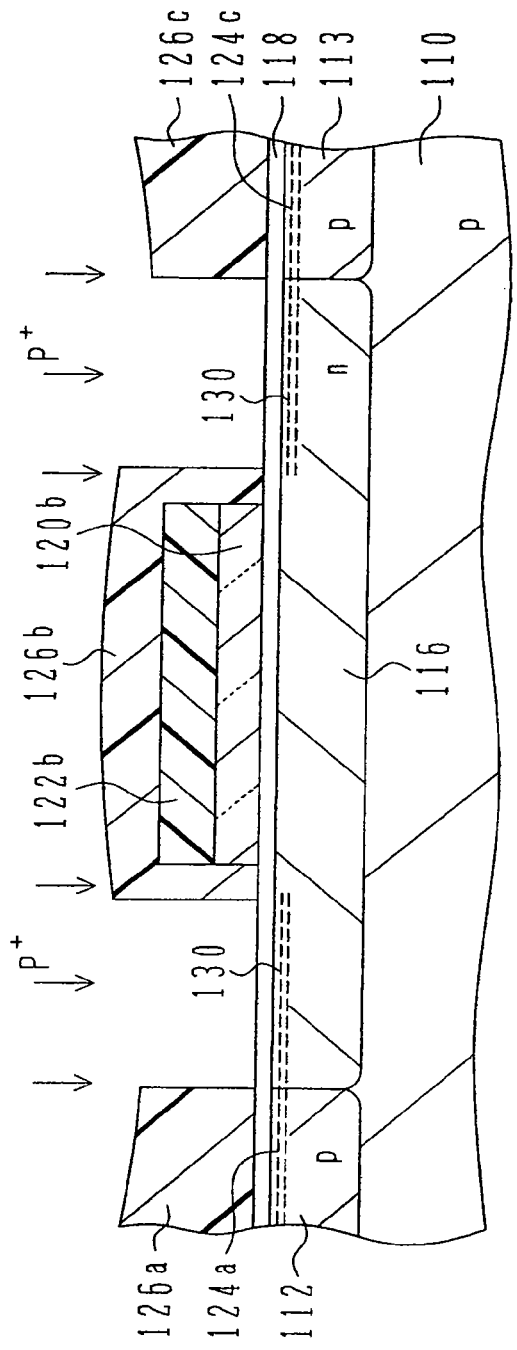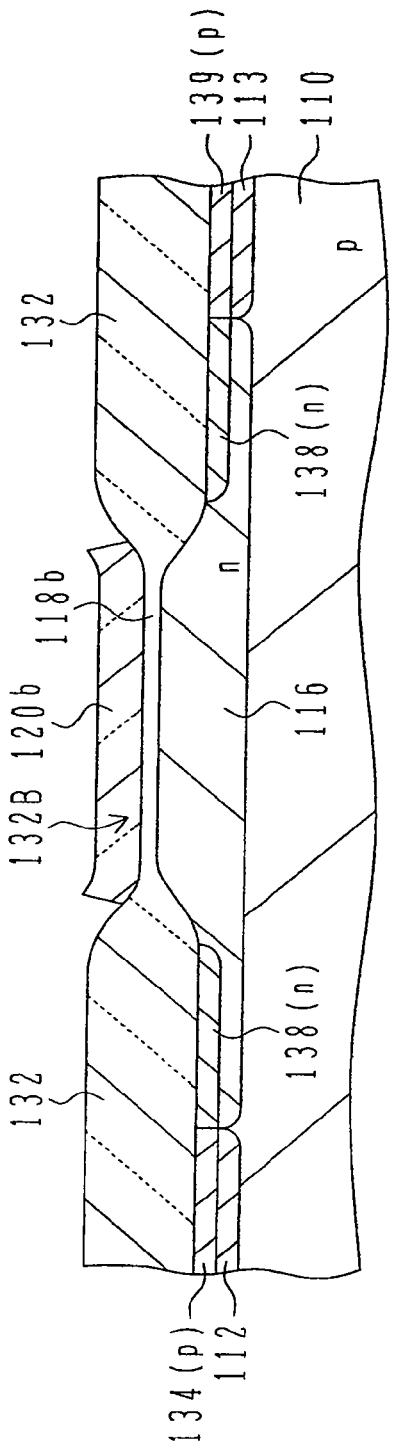

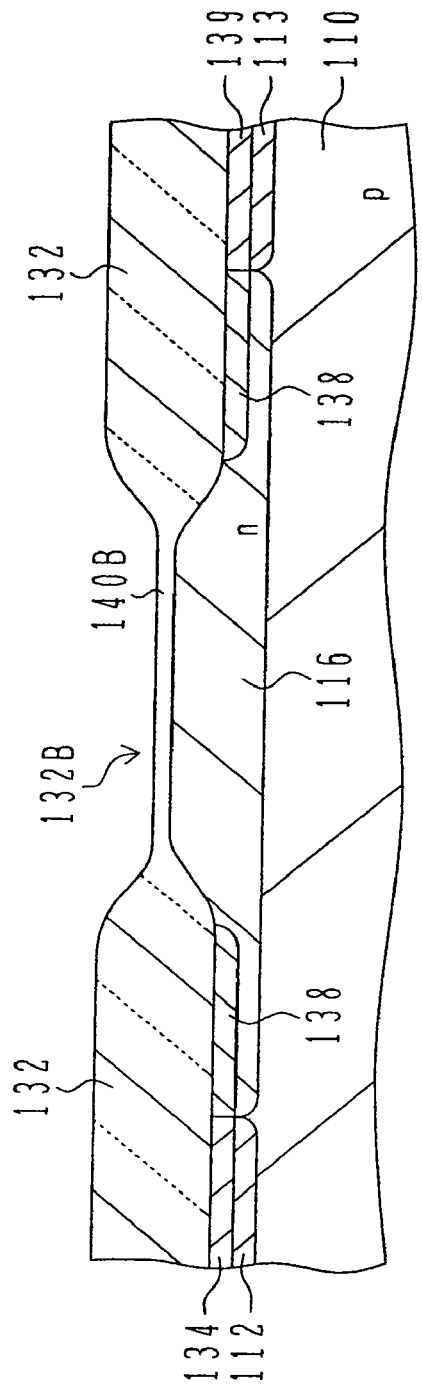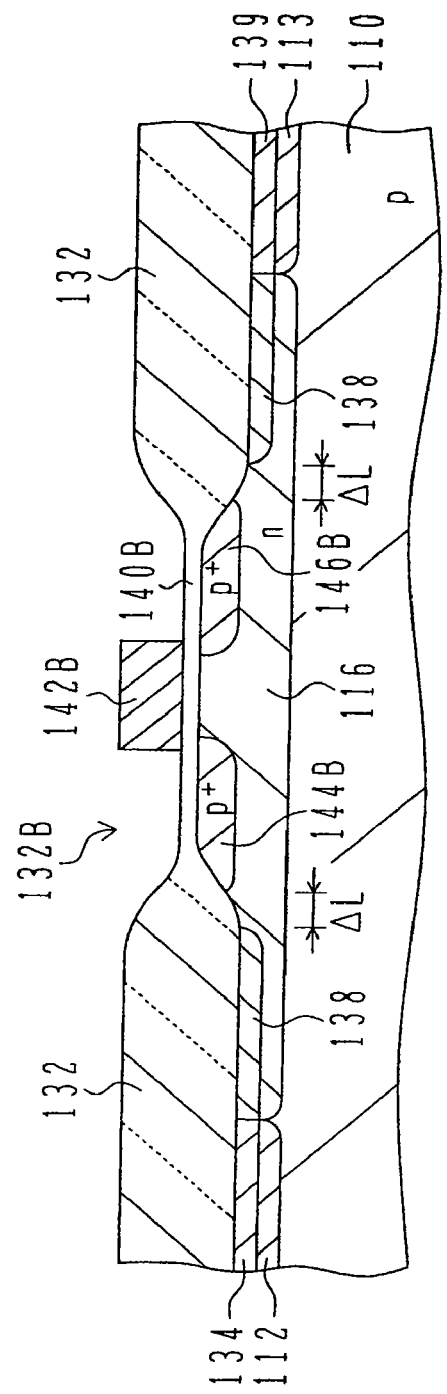

MANUFACTURE METHOD FOR SEMICONDUCTOR DEVICE HAVING FIELD OXIDE FILM

CROSS REFERENCE TO RELATED APPLICATION

This application is based on and claims priority of Japanese Patent Applications No. 2005-028699 filed on Feb. 4, 2005 and No. 2005-078628 filed on Mar. 18, 2005 and is a divisional of application Ser. No. 11/346,270, filed Feb. 3, 2006, the entire contents of which are incorporated herein by reference.

BACKGROUND OF THE INVENTION

A) Field of the Invention

The present invention relates to a method of forming a field oxide film (isolation film) suitable for the manufacture of a metal oxide semiconductor (MOS) type integrated circuit (IC), and more particularly to techniques of forming a channel stopper region just under the field oxide film and spaced apart from a device opening.

B) Description of the Related Art

A method of utilizing side spacers as illustrated in FIGS. 7A to 7C is known as a conventional method of forming a field oxide film with a channel stopper region just under the filed oxide film and spaced apart from the device opening (for example, refer to JP-A-HEI-5-136123).

In a process shown in FIG. 7A, after the surface of a p-type silicon substrate 1 is thermally oxidized to form a silicon oxide film 2, a silicon nitride film 3 is formed on the silicon oxide film 2 by chemical vapor deposition (CVD), and a silicon oxide film 4 is formed on the silicon nitride film 3 by CVD. A lamination of the silicon nitride film 3 and silicon oxide film 4 is patterned into a desired device opening pattern by dry etching using a resist layer as a mask.

Next, a silicon oxide film is formed on the silicon oxide film 2 by CVD, covering the lamination of the remaining silicon nitride film 3 and silicon oxide film 4, and thereafter this silicon oxide film is etched back by anisotropical etching to form a side spacer 4a on the silicon oxide film, the side spacer being made of a remaining portion of the silicon oxide film and covering the side wall of the lamination of the silicon nitride film 3 and silicon oxide film 4 in a closed loop shape. By using as a mask a lamination M of the silicon oxide film 2, silicon nitride film 3 and silicon oxide film 4 and a lamination of the silicon oxide film 2 and side spacer 4a, boron ions B+ are implanted into a surface layer of the substrate 1 to form a channel stopper ion doped region 5a in a peripheral area of the side spacer 4a. The silicon oxide film 4, side spacer 4a and a region of the silicon oxide film 2 not covered with the silicon nitride film 2 (a region indicated by broken lines) are etched and removed by hydrofluoric acid containing chemicals. The surface of the substrate 1 not covered with the lamination of the remaining silicon oxide film 2 and silicon nitride film 3 is therefore exposed and the surface of the ion doped region 5a is also exposed.

In a process shown in FIG. 7B, a field oxide film 6 having a device opening 6A on the surface of the substrate 1 is formed by selective oxidation using as a mask the lamination of the silicon oxide film 2 and silicon nitride film 3. Heat treatment in this process forms a p-type channel stopper region 5 in conformity with the ion doped region 5a. The channel stopper region 5 is positioned just under the field oxide film 6 and spaced apart from the device opening 6A.

In a process shown in FIG. 7C, the silicon nitride film 3 and silicon oxide film 2 are sequentially etched and removed to expose the surface portion of the substrate 1 in the device opening 6A. The silicon surface in the device opening 6A is thermally oxidized to form a gate insulating film 7 made of a silicon oxide film, thereafter a gate electrode layer 8 made of doped polysilicon or the like is formed on the gate oxide film 7, and by using as a mask the filed insulating film 6 and gate electrode layer 8, impurity ions are implanted to form $n^+$-type source/drain regions 9S and 9D. A MOS type transistor is therefore formed in the device opening 6A.

According to the above-described field oxide film forming method, the channel stopper region 5 is formed just under the field insulating film 6 and spaced apart from the device opening 6A. Therefore, as the MOS type transistor is formed in the device opening 6A as shown in FIG. 7C, (a) a pn junction will not be formed between the source/drain regions 9S and 9D and the channel stopper region 5, so that a pn junction breakdown voltage can be improved and a junction capacitance can be reduced, and (b) a channel width along a direction perpendicular to a channel longitudinal direction (a direction along which current flows between the source/drain regions) will not be narrowed by the channel stopper region 5, so that it is advantageous in that it is possible to avoid a variation (a so-called narrow channel effect) in the transistor characteristics to be caused by a narrowed channel width.

However, according to the above-described field oxide film forming method, as the silicon oxide film 4, side spacer 4a and the portion of the silicon oxide film 2 indicated by the broken line are etched and removed by hydrofluoric acid containing chemicals in the process shown in FIG. 7A, undercuts are formed in the silicon oxide film 2 just under the silicon nitride film 3. To avoid this, a field oxide film forming method has been proposed such as shown in FIGS. 8A and 8B (for example, refer to JP-A-HEI-5-136123).

In a process shown in FIG. 8A, similar to the above-description made with reference to FIG. 7A, after a silicon oxide film 2 and a silicon nitride film 3 are sequentially formed on the surface of a p-type silicon substrate 1, the silicon nitride film 3 is patterned into a desired device opening pattern. A silicon oxide film 4A is formed by CVD on the silicon oxide film 2, covering the remaining silicon nitride film 3. The silicon oxide film 4A is formed to have a closed loop portion 4b covering the side wall of the silicon nitride film 3 on the silicon oxide film 2. Thereafter, by using as a mask a lamination M' of the silicon oxide film 2, silicon nitride film 3 and silicon oxide film 4A and a lamination of the silicon oxide film 2 and closed loop portion of the silicon oxide film 4A, boron ions B+ are implanted into a surface layer of the substrate 1 via the lamination of the silicon oxide films 2 and 4A to form a channel stopper ion doped region 5a in a peripheral area of the closed loop portion 4b of the silicon oxide film 4A.

In a process shown in FIG. 8B, by using as a mask the lamination of the silicon oxide film 2, silicon nitride film 3 and silicon oxide film 4A, selective oxidation is performed to form a field oxide film 6 having a device opening 5a on the surface of the substrate 1. Heat treatment in this process forms a p-type channel stopper region 5 in conformity with the ion doped region 5a. The channel stopper region 5 is positioned just under the field oxide film 6 and spaced apart from the device opening 6A. Thereafter, the silicon oxide film 4A, silicon nitride film 3 and silicon oxide film 2 are sequentially removed to form a MOS type transistor in the device opening 6A in a manner similar to that described with reference to FIG. 7C.

According to the field oxide film forming method described above with reference to FIGS. 8A and 8B, since the silicon oxide films 2 and 4A are not removed after the ion implantation process shown in FIG. 8A, it is possible to suppress an increase and variation in a bird's beak length to be caused by undercuts of the silicon oxide film 2.

A channel stopper region forming method is known by which after a field oxide film is formed by thermal oxidation, by utilizing the oxidation mask used for thermal oxidation as an ion implantation mask, ion implantation is performed via the field oxide film to form a channel stopper ion doped region (for example, refer to JP-A-HEI-6-5588 and JP-A-HEI-6-85053). In this case, in order to suppress the formation of bird's beaks, side walls made of silicon nitride and having a thickness of about 50 nm are formed on the side wall of the oxidation mask (a so-called laterally sealed local oxidation of silicon (LOCOS) method is adopted). However, with the existence of only the side wall, it is difficult to form the channel stopper ion doped region spaced apart from the device opening of the field oxide film.

According to the channel stopper region forming method described in JP-A-HEI-6-5588, the channel stopper ion doped region can be formed spaced apart from the device opening, by forming a side wall made of polysilicon and having a thickness of about 50 nm superposed upon a side wall of silicon nitride, before the ion implantation process. According to the channel stopper region forming method described in JP-A-HEI-6-85053, the channel stopper ion doped region can be formed spaced apart from the device opening, by using as an oxidation film a lamination of a silicon oxide film, a polysilicon film and a silicon nitride film stacked in this order from the bottom and by oxidizing the sides of the polysilicon film in the oxidation film during the thermal oxidation process.

Another example of a conventional field oxide film forming method is known by which a resist layer is used as an ion implantation mask as shown in FIG. 9A to 9C (for example, refer to JP-A-2000-12789.

In a process shown in FIG. 9A, after an n-type well region 1a and a p-type well region 1b are formed on a principal surface of a silicon substrate, a silicon oxide film 2 is formed on the principal surface by thermal oxidation, and a silicon nitride film 3 is formed on the silicon oxide film 2 by CVD. A resist layer 4B is formed on the silicon nitride film 3 above the well region 1a by a photolithography process in accordance with a desired device opening pattern. Thereafter, by using the resist layer 4B as a mask, the silicon nitride film 3 is patterned by dry etching to leave the silicon nitride film 3 having a pattern corresponding to the resist layer 4B.

Next, in a process shown in FIG. 9B, a resist layer 4C is formed on the silicon oxide film 2 by a photolithography process, exposing the resist layer 4B and a nearby silicon oxide film portion and covering the p-type well region 1b. By using the resist layers 4B and 4C as a mask, n-type impurity ions are implanted into the well region 1a to form a channel stopper ion doped region 5b. The resist layers 4B and 4C are thereafter removed.

In a process shown in FIG. 9C, by using as a mask a lamination of the silicon oxide film 2 and silicon nitride film 3, selective oxidation is performed to form a field oxide film 6 on the upper surface of the substrate 1. The field oxide film 6 is therefore formed having a device opening 6A corresponding to the silicon nitride film 3. Heat treatment in this process forms an n-type channel stopper region 5B in the surface layer of the well region 1a, in conformity with the ion doped region 5b. The channel stopper region 5B is formed having an inner end positioned in the device opening 6A. Thereafter, by applying the method previously described with reference to FIG. 7C, a MOS type transistor is formed in the device opening 6A.

According to the field oxide film forming method described with reference to FIGS. 7A to 7C, considering the process shown in FIG. 7A as a usual ion implantation process of implanting boron ions $B^+$ at an acceleration energy of 100 keV or higher, the mask function of the lamination of the silicon oxide film 2 and side spacer 4a is not sufficient (there is a possibility of ion penetration). It is necessary to additionally form a resist layer covering the lamination M and side spacer 4a in order to reinforce the ion implantation mask. This is because an ion suppression ability of silicon oxide constituting the side spacer 4a is low. Also in the ion implantation process shown in FIG. 8A, the mask function of the lamination of the silicon oxide film 2 and closed loop portion 4b is not sufficient. It is necessary to additionally form a resist layer covering the lamination M' and closed loop portion 4b in order to reinforce the ion implantation mask. If the resist mask is additionally formed to reinforce the ion implantation mask, a trouble may occur such as resist peel-off and lower manufacture yield.

According to the field oxide film forming method described above with reference to FIGS. 8A and 8B, a process time is elongated because of thermal oxidation via the lamination of the silicon oxide films 2 and 4A, more than the field oxide film forming method described above with reference to FIGS. 7A to 7C.

As described above, in the channel stopper region forming method by which ion implantation is performed via the field oxide film after the field oxide film is formed, and since the ion implantation is performed via the thick field oxide film of about 600 nm, it is necessary to use an expensive ion implanter having an acceleration energy of 200 keV or higher.

According to the field oxide film forming method described above with reference to FIGS. 9A to 9C, although processes are simple, since the channel stopper region 5B is formed extending in the device opening 6A, it is not possible to obtain the operation effects (a) and (b) described previously.

SUMMARY OF THE INVENTION

An object of the present invention is to provide a novel semiconductor device manufacture method capable of forming a channel stopper region just under a field oxide film and spaced apart from a device opening, with ease and at high precision.

According to one aspect of the present invention, there is provided a first semiconductor device manufacture method comprising steps of:

preparing a silicon substrate having at least one region of one conductivity type;

laminating a first silicon oxide film, a silicon nitride film and a second silicon oxide film in a recited order from the bottom on a principal surface of the silicon substrate;

patterning a lamination including at least the silicon nitride film and the second silicon oxide film among the first silicon oxide film, the silicon nitride film and the second silicon oxide film, in accordance with a desired device opening pattern;

forming a side spacer made of silicon nitride and covering a side of the lamination;

implanting impurity ions of the one conductivity type into the principal surface of the silicon substrate by using the lamination and the side spacer as a mask to form a channel stopper ion doped region; and after the side spacer is removed, forming a field oxide film having a device opening corresponding to the lamination on the principal surface of the silicon substrate through selective oxidation using the lamination as a mask, and forming a channel stopper region of the one conductivity type on the basis of the ion doped region.

According to the first semiconductor device manufacture method, the channel stopper ion doped region is formed by implanting impurity ions by using as a mask a lamination of at least the silicon nitride film and second silicon oxide film and the side spacer of silicon nitride covering the side of the lamination. After the side spacer of the lamination is removed, the field oxide film having the device opening corresponding to the lamination is formed by selective oxidation by using the lamination as a mask, and the channel stopper region is formed by ion implantation. Since the ion implantation is performed by using the side spacer as a mask, the channel stopper region is formed just under the field oxide film and being spaced apart from the device opening. In this case, since the side spacer is made of silicon nitride having a high ion suppression ability and the silicon nitride film in the lamination is side-etched while the side spacer is removed, it is possible to make the channel stopper region be reliably spaced apart from the device opening. Accordingly, it is not necessary to additionally use a resist layer and simplify the process. Since selective etching is performed by using as a mask the lamination after the side spacer is removed, it is possible to form the field oxide film and channel stopper region in a relatively short process time.

In the first semiconductor device manufacture method, the second silicon oxide film may be a silicon oxide film formed by thermally oxidizing a polysilicon film deposited on the silicon nitride film. It is therefore possible to improve the ion suppression ability of the second silicon oxide film and prevent defective products due to ion penetration. In this case, before the polysilicon film is deposited on the silicon nitride film, the silicon nitride film may be made dense by heat treatment. It is therefore possible to improve tight adhesion between the polysilicon film and silicon nitride film and prevent defective products due to polysilicon peel-off or the like.

In the first semiconductor device manufacture method, the second silicon oxide film may be a silicon oxide film deposited on the silicon nitride film and thereafter made dense by heat treatment. It is therefore possible to improve ion suppression ability of the second silicon oxide film and prevent defective products due to ion penetration.

According to the first semiconductor device manufacture method, the channel stopper ion doped region is formed by implanting impurity ions by using as a mask a lamination of at least the silicon nitride film and second silicon oxide film and the side spacer of silicon nitride covering the side of the lamination. After the side spacer of the lamination is removed, the field oxide film having the device opening corresponding to the lamination is formed by selective oxidation by using the lamination as a mask, and the channel stopper region is formed by ion implantation. Accordingly, it is possible to form the channel stopper region spaced apart from the device opening easily and at high precision.

According to another aspect of the present invention, there is provided a second semiconductor device manufacture method comprising steps of:

preparing a silicon substrate having a principal surface and one conductivity type at least in a device forming region;

forming an oxidation mask material layer covering the device forming region on the principal surface of the silicon substrate;

forming a first resist layer on the oxidation mask material layer in accordance with a first device opening pattern corresponding to a portion of the device forming region;

forming a first ion doped region for a channel stopper by implanting impurity ions of the one conductivity type into the principal surface of the silicon substrate via the oxidation mask material layer by using the first resist layer as a mask;

after the first ion doped region is formed, isotropically etching the first resist layer to reduce a thickness and a planar size of the first resist layer by a predetermined amount;

after the isotropical etching, patterning the oxidation mask material layer by etching using the first resist layer as a mask to form a first oxidation mask made of a remaining portion of the oxidation mask material layer; and after the first resist layer is removed, forming a field oxide film having a device opening corresponding to the first oxidation mask on the principal surface of the silicon substrate through selective oxidation using the first oxidation mask and forming a first channel stopper region of said one conductivity type corresponding to the first ion doped region.

According to the second semiconductor device manufacture method, the channel stopper ion doped region is formed by impurity ion implantation using the resist layer as a mask. After the resist layer is isotropically etched to reduce the thickness and lateral size thereof by a predetermined amount, the oxidation mask layer is etched and patterned by using the resist layer as a mask to form the oxidation mask. After the resist layer is removed, the field oxide film having the device opening corresponding to the oxidation mask is formed by selective oxidation by using the oxidation mask, and the channel stopper region is formed by ion implantation. By setting the predetermined amount before hand in accordance with a distance between the device opening and channel stopper region, the channel stopper region can be formed precisely just under the field oxide film and being spaced apart from the device opening by a desired distance.

According to still another aspect of the present invention, there is provided a third semiconductor device manufacture method comprising steps of:

preparing a silicon substrate having a principal surface and a device forming region of one conductivity type and a well region of an opposite conductivity type opposite to the one conductivity type;

forming an oxidation mask material layer covering the device forming region and the well region on the principal surface of the silicon substrate;

forming first and second resist layers on the oxidation mask material layer in accordance with a first device opening pattern corresponding to a portion of the device forming region and a second device opening pattern corresponding to a portion of the well region;

forming a first ion doped region for a channel stopper by implanting impurity ions of the one conductivity type into the principal surface of the silicon substrate via the oxidation mask material layer by using the first and second resist layers as a mask;

after the first ion doped region is formed, isotropically etching the first and second resist layers to reduce a thickness and a planar size of the first and second resist layers by a predetermined amount;

forming a third resist layer covering the device forming region and the first resist layer, and forming a fourth resist layer not covering an ion doped region existing in the well region as a portion of the first ion doped region and covering a side of the second oxidation mask and the second resist layer;

implanting impurity ions of the opposite conductivity type into the well region by using as a mask the third and fourth resist layers to form a second ion doped region for a channel stopper by compensating for the ion doped region existing in the well region as a portion of the first ion doped region;

after the third and fourth resist layers and the first and second resist layers are removed, forming a field oxide film having first and second device openings corresponding to the first and second oxidation masks on the principal surface of the silicon substrate through selective oxidation using the first and second oxidation masks, a first channel stopper region having the one conductivity type and corresponding to the first ion doped region and a second channel stopper region having the opposite conductivity type and corresponding to the second ion doped region.

In the third semiconductor device manufacture method, in the one conductivity type is a p-type, the silicon substrate is prepared which has the p-type device forming region and the n-type well region. In the p-type device forming region, similar to the first semiconductor device manufacture method, the processes are executed including a process of forming the oxidation mask material layer, a process of forming the first resist layer, a process of forming the first ion doped region, a process of reducing the thickness and planar size of the first resist layer, a process of forming the first oxidation mask and a process of forming the third resist layer. In the n-type well region, the processes common to those for the p-type device forming region are executed including a process of forming the oxidation mask material layer, a process of forming the second resist layer, a process of forming the first ion doped region, a process of reducing the thickness and lateral size of the second resist layer, a process of forming the second oxidation mask and a process of forming the fourth resist layer.

In the process of forming the third and fourth resist layers, the third resist layer is formed covering the device forming region and first resist layer, whereas the fourth resist layer is formed not covering an ion doped region existing in the n-type well region as a portion of the first ion doped region and covering a side of the second oxidation mask and the second resist layer. Impurity ions of the n-type are implanted into the n-type well region by using as a mask the third and fourth resist layers to form a second ion doped region for a channel stopper by compensating for the ion doped region existing in the n-type well region as a portion of the first ion doped region.

After the third and fourth resist layers and the first and second resist layers are removed, there are formed a field oxide film having first and second device openings corresponding to the first and second oxidation masks on the principal surface of the silicon substrate through selective oxidation using the first and second oxidation masks, a p-type first channel stopper region corresponding to the first ion doped region and an n-type second channel stopper region corresponding to the second ion doped region. The first channel stopper region can be formed precisely just under the field oxide film and being spaced apart from the first device opening, whereas the second channel stopper region is formed precisely just under the field oxide film and being spaced apart from the second device opening.

According to the second semiconductor device manufacture method, in the device forming region of the one conductivity type, the channel stopper region can be formed easily and at high precision just under the field oxide film and being spaced apart from the device opening. Since the number of processes is small, a manufacture yield can be improved and cost reduction can be achieved.

According to the third semiconductor device manufacture method, in both the device forming region of the one conductivity type and the opposite conductivity type well region, the channel stopper region can be formed easily and at high precision just under the field oxide film and being spaced apart from the device opening. Since an increase in the number of processes can be suppressed, a manufacture yield can be improved and cost reduction can be achieved.

BRIEF DESCRIPTION OF THE DRAWINGS

FIGS. 1A to 1J are cross sectional views illustrating main processes of a MOS type IC manufacture method according to a first embodiment of the present invention.

FIGS. 3A to 3H are cross sectional views illustrating main processes of a manufacture method for an n-channel MOS type transistor of a CMOS type IC according to a second embodiment of the present invention.

FIGS. 6A to 6H are cross sectional views illustrating main processes of a manufacture method for a p-channel MOS type transistor of the CMOS type IC described with reference to FIGS. 3A to 3H.

DESCRIPTION OF THE PREFERRED EMBODIMENTS

Figure 2:
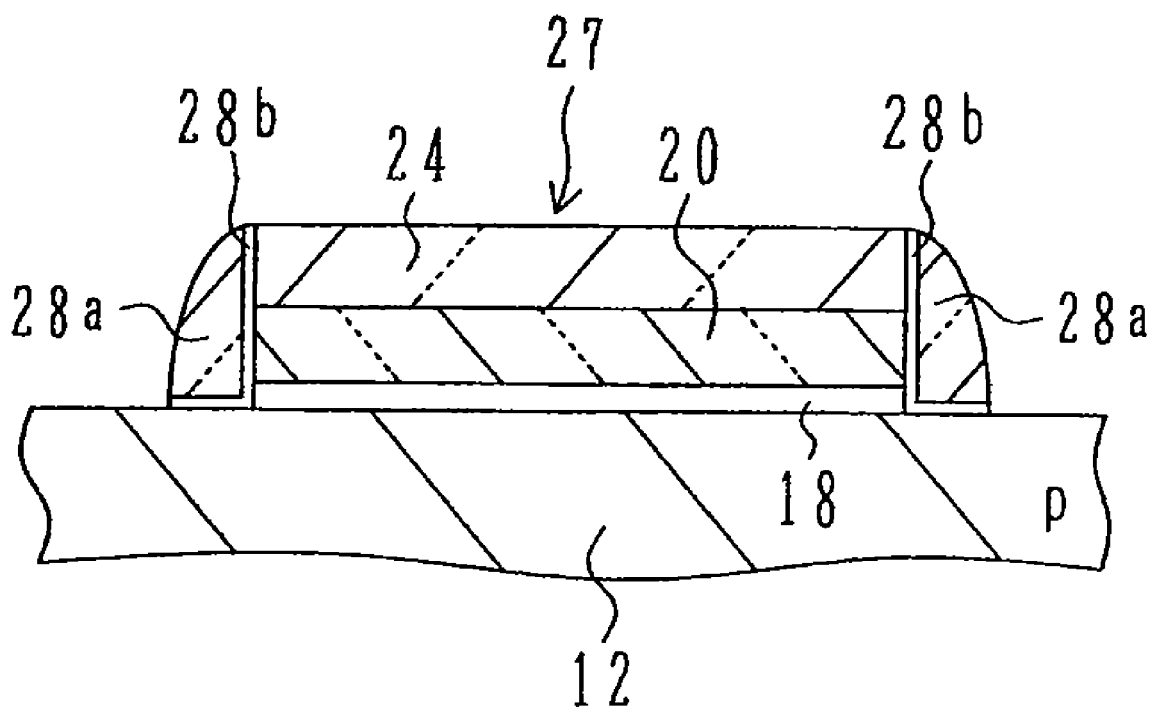
FIG. 2 is a cross sectional view showing a modification of a side spacer portion.

FIGS. 1A to 1J illustrate a manufacture method for a metal oxide semiconductor (MOS) type integrated circuit (IC) using a field oxide film forming method according to the first embodiment of the present invention. Processes corresponding to FIGS. 1A to 1J will be described sequentially.

In a process shown in FIG. 1A, a p-type well region 12 and n-type well regions 14 and 16 are formed side by side on a principal surface of a p-type silicon substrate 10 by a well-known method. The n-type well regions 14 and 16 may be formed as one well region surrounding the p-type well region 12. After the well regions 12 to 16 are formed, a silicon oxide film (stress relaxing pad oxide film) 18 is formed on the principal surface of the substrate 10 by thermal oxidation. A thickness of the silicon oxide film 18 may be, for example, in a range from 30 nm to 40 nm. A silicon nitride film 20 is formed on the silicon oxide film 18 by CVD, and a polysilicon film 22 is formed on the silicon nitride film 20 by CVD. A thickness of the polysilicon film 22 is determined by considering the ion implantation conditions and the thickness of the silicon nitride film 20. For example, if boron ions $B^+$ are implanted at an acceleration energy of 100 keV, a thickness of the silicon nitride film 20 may be 170 nm and a thickness of the polysilicon film 22 may be 200 nm to 300 nm (preferably 250 nm).

Before the polysilicon film 22 is deposited on the silicon nitride film 20, it is preferable that the silicon nitride film 22 is made dense by heat treatment in an oxidizing atmosphere. This heat treatment makes dense the film quality of the silicon nitride film 20 and forms a very thin silicon oxide film on the surface of the silicon nitride film 20. Therefore, as the polysilicon film 22 is deposited on the silicon nitride film, tight adhesion between the silicon nitride film 20 and polysilicon film 22 can be improved to thereby prevent defective products due to polysilicon peel-off.

Next, in a process shown in FIG. 1B, the polysilicon film 22 is oxidized by thermal oxidation to form a silicon oxide film 24. For example, the thermal oxidation may be performed by using a vertical furnace under the conditions of a temperature of 950° C. and a gas flow rate of $O_2/H_2$=13.3/7(l/min). Since the polysilicon film 22 is oxidized by thermal oxidation, the silicon oxide film 24 can be formed which has a high ion suppression ability and a highly dense film quality. As the silicon oxide film 24, a silicon oxide film may be used which is deposited on the silicon nitride film 20 by CVD. Alternatively, a silicon oxide film may be used which is deposited on the silicon nitride film 20 and made dense by heat treatment. If the silicon oxide film deposited by CVD and thereafter made dense by heat treatment is used, this silicon oxide film has a high ion suppression ability.

In a process shown in FIG. 1C, a resist layer 26 is formed on the silicon oxide film 24 by a photolithography process, in accordance with a predetermined device opening (active region forming opening) pattern. In a process shown in FIG. 1D, by using the resist layer 26 as a mask, a lamination film of the silicon oxide film 24, silicon nitride film 20 and silicon oxide film 18 is patterned by etching to form a mask lamination 27 made of the remaining portion of the films 18, 20 and 24) of the lamination film.

The silicon oxide film 24 may be patterned by dry etching. For this patterning, microwave plasma etching (frequency of 2.45 MHz) or electron cyclotron resonance (ECR) plasma etching may be used under the conditions of a pressure of several mTorr using mixture gas of $Cl_2/O_2$, $CF_4$ gas or $SF_6$ gas as etching gas. The silicon nitride film 20 may be patterned by dry etching. For this patterning, radio frequency (RF) plasma etching may be used under the conditions of a pressure of 160 mTorr using mixture gas of $CF_4/CHF_4$ as etching gas. In this case, an RF power may be set to about 700 W and a frequency may be set to 13.56 MHz.

In patterning the silicon oxide film 18, it is preferable to use etching capable of maintaining clean the substrate surface and providing a high etching selection ratio relative to the silicon nitride film 20 and silicon substrate 10, without using etching which absorbs impurities or leaves a damage layer on the substrate surface where devices such as MOS type transistors are formed. For example, the silicon oxide film 18 may be etched by wet etching using buffered hydrofluoric acid (HF+$NH_4F$+($H_2O$)) or the like. The silicon oxide film 18 may be left without being patterned. If the silicon oxide film 18 is left, a contamination problem on the silicon substrate surface does not occur and channeling preventive advantages can be expected during ion implantation.

After etching, the resist layer 26 is removed by $O_2$ or $O_3$ ashing. Chemical processing using sulfuric acid+hydrogen peroxide and pure water processing are sequentially performed, and then drying is performed. In a process shown in FIG. 1E, a side spacer forming silicon nitride film 28 covering the lamination 27 is formed on the surface of the substrate 10 by low pressure CVD or the like. A thickness of the silicon nitride film 28 may be 100 nm to 250 nm (preferably, 120 nm to 180 nm, more preferably 150 nm). In forming the silicon nitride film 28, pylolytic CVD may be used using silane containing gas ($SiH_4$, $Si_2H_8$ or the like) or tetraethoxysilane (TEOS) containing gas as source gas and mixture gas of oxygen ($O_2$) or ozone ($O_3$) and NOx as reaction gas. Plasma enhanced CVD using these gases may be used or high density plasma CVD such as ECR plasma may be used. With high density plasma CVD, a film can be formed quickly at a low temperature.

Next, the silicon nitride film 28 is etched back by anisotropic dry etching to form a side spacer 28a. The side spacer 28a is made of a remaining portion of the silicon nitride film 28 and formed in a closed loop shape covering the side of the lamination 27 on the surface of the substrate 10. For anisotropic dry etching, RF plasma etching may be performed by using mixture gas of CF4 and CHF3 at a mixture ratio of 1:2 as etching gas and under a condition of a pressure of 160 mTorr. In this case, an RF power may be set to about 700 W and a frequency may be set to 13.56 MHz. A thickness of the side spacer 28a along a direction departing from the side of the lamination 27 can be set to about 150 nm. As described above, if the silicon oxide film 18 is left in the process shown in FIG. 1D, the silicon oxide film 18 is left just under the side spacer 28a. In this case, the silicon oxide film 18 outside the remaining portion just under the side spacer 28a may be removed or may be left (the advantage obtained if the silicon oxide film is left is the same as described above).

In a process shown in FIG. 1F, a resist layer 30 is formed on the principal surface of the substrate 10 by a photolithography process, covering the n-type well regions 14 and 16 and exposing the p-type well region 12. By using as a mask the resist layer 30, lamination 27 and side spacer 28a, boron ions $B^+$ are implanted into the surface layer of the p-type well region 12 to form a channel stopper ion doped region 32. The ion implantation conditions may be an acceleration energy of 100 keV and a dose of $1.5\times10^{13}$ $cm^{-2}$. The ion doped region 32 is formed in a closed loop shape in a peripheral area of the side spacer 28a and spaced apart from the side of the lamination by a distance corresponding to a thickness (e.g., about 150 nm) of the side spacer 28a.

In a process shown in FIG. 1G, the resist layer 30 and side spacer 28a are removed. For example, the side spacer 28a can be removed by isotropical wet etching for about 50 minutes using hot phosphoric acid at 160° C. The silicon nitride film 20 constituting the lamination 27 is side-etched and retracted so that a distance from the ion doped region 32 increases. In order to mitigate the influence of side etching, isotropic dry etching is performed by using a plasma etcher under the following conditions:

Gas flow rate: $CF_4/O_2$=100 sccm to 200 sccm (preferably 150 sccm)
Pressure: 0.5 Torr to 1 Torr
RF power: 250 W to 500 W
Cathode temperature: 80° C.

The volume ratio of $O_2$ gas is 8% to 15% compared to that of $CF_4$ gas. The gas flow rate of the mixture gas of $CF_4$ and $O_2$ is 100 sccm to 200 sccm (preferably 150 sccm).

Under these conditions, an etch rate of silicon nitride is about 80 nm/min.

In order to improve controllability of a side etch amount of the silicon nitride film 20, anisotropic dry etching is first performed in the dry etching of the side spacer 28a. The conditions of anisotropic dry etching may be:

Gas flow rate: $CHF_3/CF_4/N_2$=60 to 100/60 to 100/10 to 20 sccm (preferably 90/90/15 sccm)
Pressure: 300 mTorr to 500 mTorr
RF power: 500 W to 700 W.

A parallel plate plasma etcher or the like can be used as an etcher. At the stage when a thickness of the side spacer 28a becomes thin by the anisotropic dry etching, the above-described isotropic etching is performed. In this manner, as the isotropic etching is performed after the anisotropic dry etching, a process time of the isotropic dry etching becomes short and the side etch amount of the silicon nitride film 20 becomes small.

FIG. 2 shows an example of a modification of the side spacer portion. In FIG. 2, like elements to those shown in FIG. 1E and etc. are represented by identical reference numerals and symbols, and the description thereof is omitted. This example is characterized in that a thin silicon oxide film 28b is disposed between the side spacer 28a and the lamination 27 and p-type well region 12.

In forming the side spacer structure shown in FIG. 2, in the process shown in FIG. 1E, the silicon oxide film 28b is deposited to a thickness of, e.g., 30 nm to 60 nm (preferably 50 nm) before the silicon nitride film 28 is deposited in the process shown in FIG. 1E. Thereafter, in a manner similar to that described above, a silicon nitride film 28 is deposited to a thickness of, e.g., 90 nm to 120 nm (preferably 100 nm). The silicon nitride film 28 may also be deposited to a thickness of, e.g., 120 nm to 150 nm (preferably 130 nm), according to necessity. Thereafter, in a manner similar to that described above, the lamination of the silicon oxide film 28b and silicon nitride film 28 is etched back to form the side spacer 28a and leave the silicon oxide film 28b between the side spacer 28a and the lamination 27 and p-type well region 12.

According to the side spacer structure shown in FIG. 2, even if the side spacer 28a is isotropically etched by wet etching in the process shown in FIG. 1G, the silicon nitride film 20 will not be side-etched because of the existence of the silicon oxide film 28b. The size controllability is therefore improved. It is easy to remove only the silicon oxide film 28b by wet etching or the like after the side spacer 28a is removed.

In a process shown in FIG. 1H, a field oxide film 34 having a device opening 34A on the surface of the substrate 10 is formed by selective oxidation using the lamination 27 as a mask. Heat treatment in this process forms the p-type channel stopper region 36 just under the field oxide film 34 and spaced apart from the device opening 36A, in conformity with the ion doped region 32. For example, for selective oxidation, wet thermal oxidation may be performed at a temperature of 1000° C. using a lateral diffusion furnace, and a silicon oxide film having a thickness of 350 nm to 1000 nm (preferably 400 nm to 600 nm, more preferably 500 nm) can be formed as the field oxide film 34.

In a process shown in FIG. 1I, the silicon oxide film 24, silicon nitride film 20 and silicon oxide film 18 constituting the lamination 27 are sequentially removed. The silicon oxide films 24 and 18 can be removed by wet etching using buffered hydrofluoric acid, and the silicon nitride film 20 can be removed by wet etching for about 60 minutes using hot phosphoric acid at a temperature of 160° C.

On the silicon surface with the silicon oxide film 18 in the device opening 34A being removed, a silicon oxide film having a thickness of 30 nm to 50 nm is formed as a sacrificial oxide film by thermal oxidation. Thermal oxidation can be performed at a temperature of 950° C. in dry $O_2$ (or dry air). After the silicon oxide film as the sacrificial oxide film is removed by using hydrofluoric acid, a silicon oxide film as a gate insulating film 38 is formed on the silicon surface in the device opening 34A by thermal oxidation. Thermal oxidation can be performed at a temperature of 950° C. in dry $O_2$. A thickness of the silicon oxide film as the gate insulating film 38 may be 6.5 nm to 35 nm (preferably 12 nm to 20 nm, more preferably 15 nm).

The gate insulating film 38 is not limited to a single layer silicon oxide film formed in the above manner, but it may be a lamination of a silicon oxide film and a silicon nitride film (or silicon oxynitride film) stacked on the silicon oxide film, a lamination of a tantalum oxide film (or high dielectric constant film) and a silicon oxide film or a silicon nitride film (or silicon oxynitride film), or a sandwich structure having a silicon nitride film (or silicon oxynitride film) or a high dielectric constant film) intervened between two silicon oxide layers.

In a process shown in FIG. 1J, after a gate electrode material layer such as doped polysilicon is deposited on the substrate upper surface, the gate electrode material layer is patterned by photolithography and dry etching to form a gate electrode layer 40 on the gate insulating film 38. By using as the mask the field oxide film 34 and gate electrode layer 40, n-type impurity ions such as phosphorus ions are implanted into the surface layer of the p-type well region 12 and annealed to activate implanted impurity ions to form $n^+$-type source/drain regions 42 and 44. An n-channel MOS type transistor is therefore formed in the device opening 34A. The structure and the manufacture method for the MOS type transistor are not limited to those described above, but various well-known structures and manufacture methods may be used. By using a well-known method, a p-channel MOS type transistor can also be formed in the device opening corresponding to the n-type well regions 14 and 16. Not only MOS type transistors but also circuit elements such as MOS type capacitors and resistor elements can be formed in the device openings.

According to the above-described field oxide film forming method, since the channel stopper region 36 is formed just under the field oxide film 34 and spaced apart from the device opening 34A as shown in FIG. 1H, a sufficient distance $\Delta L$ can be maintained between the source/drain regions 42 and 44 and the channel stopper region 36 as shown in FIG. 1J, so that it is possible to realize improvement on the junction breakdown voltage and reduction in the junction capacitance. Since the channel width will not be narrowed by the channel stopper region 36, it is possible to prevent deterioration (an increase in a threshold voltage and a reduction in a drain current) of the transistor characteristics to be caused by the narrow channel effect. Moreover, since the process shown in FIG. 1E provides a sufficient mask function by using silicon nitride having a high ion suppression ability as the material of the side spacer 28a and the process shown in FIG. 1G side-etches the silicon nitride film 20, the process shown in FIG. 1H can reliably make the channel stopper region 36 be spaced apart from the device opening 34A. Furthermore, the mask function of the silicon oxide film 24 is improved by a combination of improvement on the mask function of the side spacer 28a and a dense film quality of the silicon oxide film 24, so that it is not necessary to form additionally a resist layer covering the lamination 27 and side spacer 28a in the ion implantation process show in FIG. 1F, resulting in a simplified process and the improvement on manufacture yield.

FIGS. 3A to 3H illustrate a manufacture method for an n-channel MOS type transistor of a complementary metal oxide semiconductor (CMOS) type IC according to the second embodiment of the present invention. Processes corresponding to FIGS. 3A to 3H will be described sequentially.

Figure 3A:
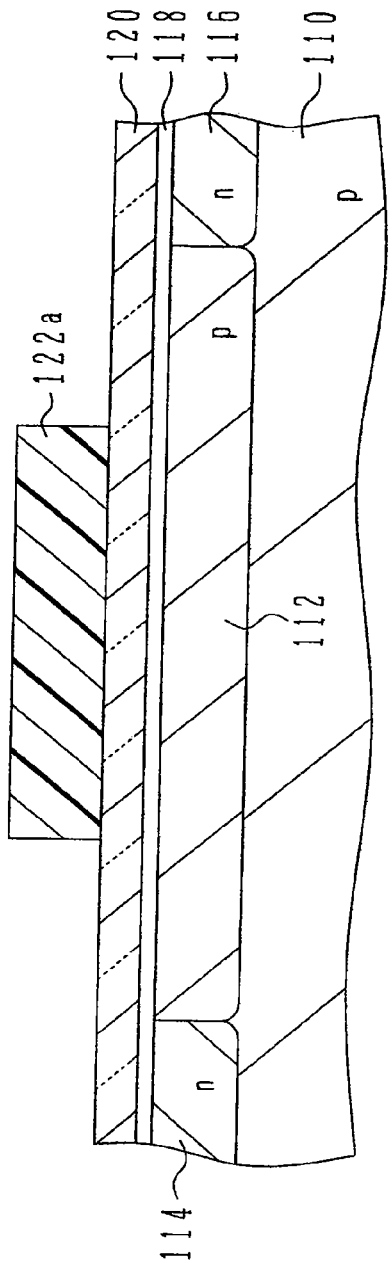

In a process shown in FIG. 3A, a p-type well region 112 and n-type well regions 114 and 116 are formed side by side on a principal surface of a p-type silicon substrate 110 by a well-known method. The n-type well regions 114 and 116 may be formed as one well region surrounding the p-type well region 112. After the well regions 112 to 116 are formed, a silicon oxide film (stress relaxing pad oxide film) 118 is formed on the principal surface of the substrate 110 by thermal oxidation. A thickness of the silicon oxide film 118 may be, for example, in a range from 30 nm to 40 nm. A silicon nitride film 120 is formed on the silicon oxide film 118 by CVD. A thickness of the silicon nitride film 120 may be 75 nm to 150 nm (preferably 100 nm).

A resist layer 122a is formed on the silicon nitride film 120 by a photolithography process, in accordance with a predetermined device opening (active region forming opening) pattern. The material of the resist layer 122a may be novolak based resist and a thickness thereof may be 700 nm to 1200 nm (preferably 900 nm).

Figure 3B:
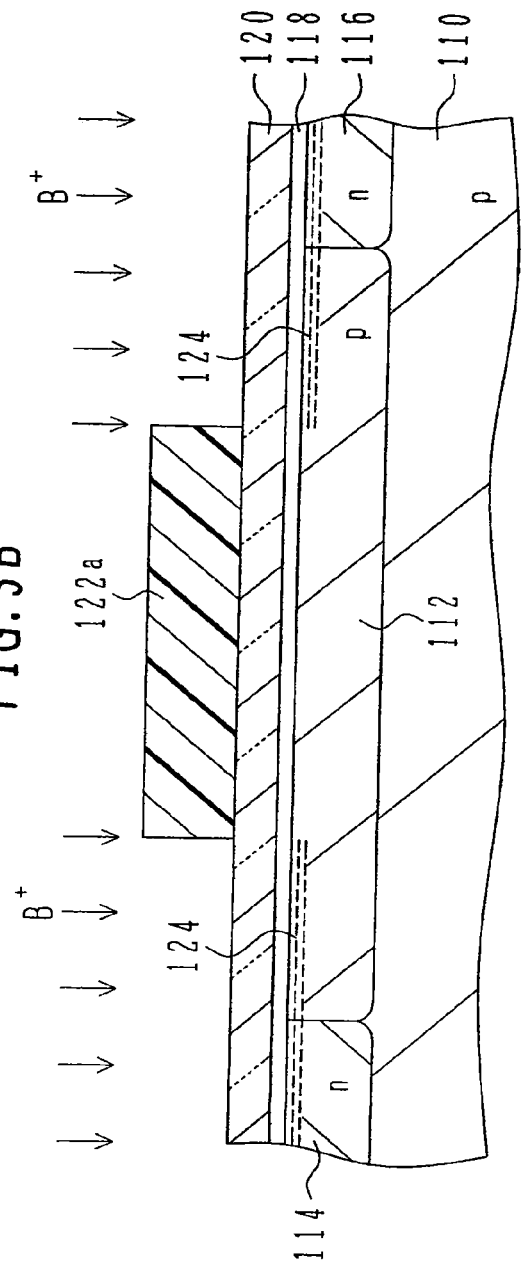

Next, in a process shown in FIG. 3B, by using the resist layer 122a as a mask, p-type impurity ions are implanted into the surface layer of the well regions 112 to 116 via a lamination of the silicon oxide film 118 and silicon nitride film 120 to form a channel stopper ion doped region 124 in a peripheral area of the resist layer 122a in a closed loop shape. For example, in this ion implantation process, boron ions $B^+$ are implanted under the conditions of an acceleration energy of 100 keV and a dose of $1.5 \times 10^{13}$ cm$^{-2}$.

Figure 3C:
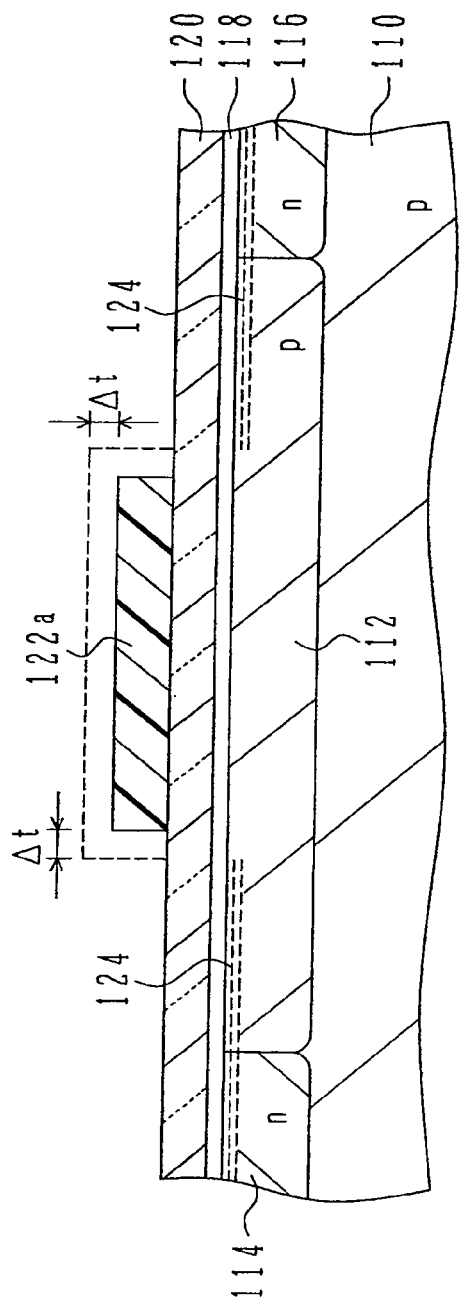

In a process shown in FIG. 3C, the resist layer 122a is isotropically dry-etched to reduce a thickness and planar size of the resist layer 122a by a predetermined amount Δt. Therefore, the edge position of the resist layer 122a is retracted from the inner end of the ion doped region 124 by an amount corresponding to the etching amount Δt. The dry etching conditions may be:

Gas flow rate: $O_2$=100 sccm
Pressure: 0.3 Torr
RF power: 125 W

The following Table 1 shows a relation between a process time (s) and an etching amount (resist retracted amount) Δt (nm) during resist etching under the above-described conditions. In Table 1, the "etching amount" is an average value of etching amounts measured at nine measurement points predetermined on the surface of a wafer (substrate 110).

TABLE 1

| Process time (s) | Etching amount (nm) |
|---|---|
| 60 | 64.3 |
| 90 | 95.2 |
| 120 | 124.0 |
| 150 | 153.9 |
| 180 | 182.6 |
| 210 | 214.1 |
| 240 | 241.6 |
| 270 | 274.3 |

Figure 4:
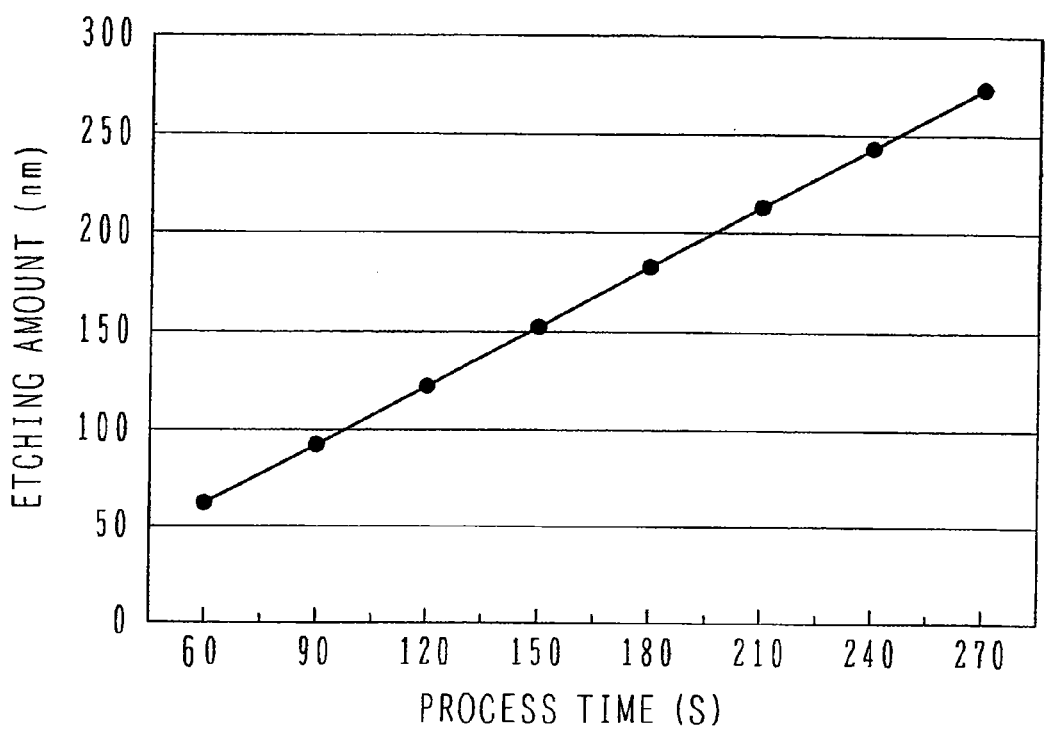
FIG. 4 is a graph showing a relation between a process time and a resist etching amount (retracted amount) in a resist etching process shown in FIG. 3C.

FIG. 4 is a graph showing the relation between the process time and etching amount shown in Table 1. It can be understood from Table 1 and FIG. 4 that the etching amount Δt is almost proportional to the process time. The etching amount Δt in the process shown in FIG. 3C may be in a range equal to or larger than 150 nm. This will be described later with reference to Table 2 and FIG. 5.

Figure 3D:
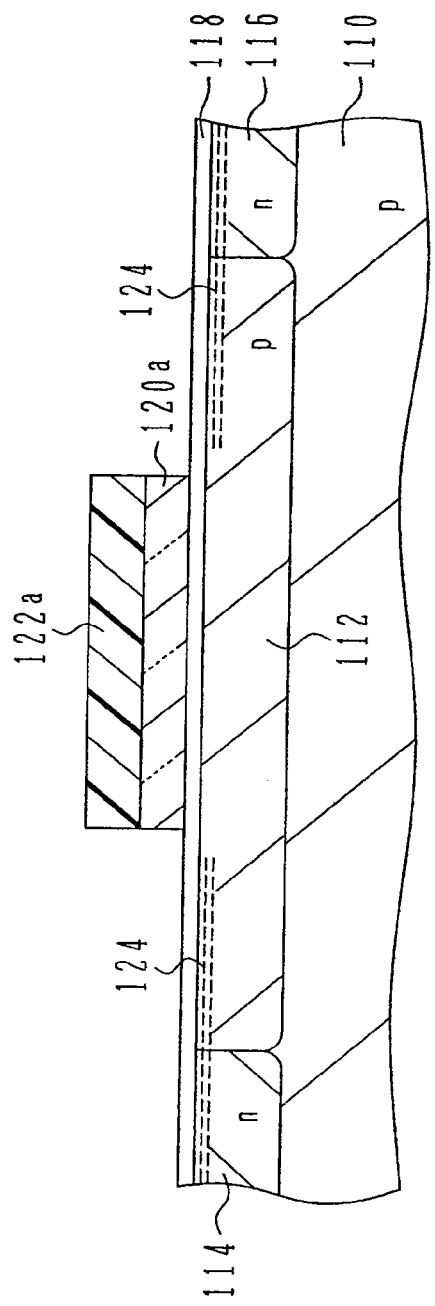

Next, in a process shown in FIG. 3D, by using the resist layer 122a as a mask, the silicon nitride film 120 is patterned by anisotropical dry etching to form an oxidation mask 120a made of the remaining portion of the silicon nitride film 120. This etching may be performed by RF plasma etching under the etching conditions of:

Etching gas: $CF_4/CHF_4$
Pressure: 160 mTorr
RF power: 700 W (13.56 MHz)

After the oxidation mask 120a is formed, by using as a mask a lamination of the oxidation mask 120a and resist layer 122a, a portion of the silicon oxide film 118 not covered with the oxidation mask 120a may be removed to expose the surfaces of the well regions 112 to 116. However, if the silicon oxide film 118 is not etched but left as shown, contamination of the silicon substrate surface can be prevented and a channeling preventive effect during ion implantation can be expected.

Figure 3E:
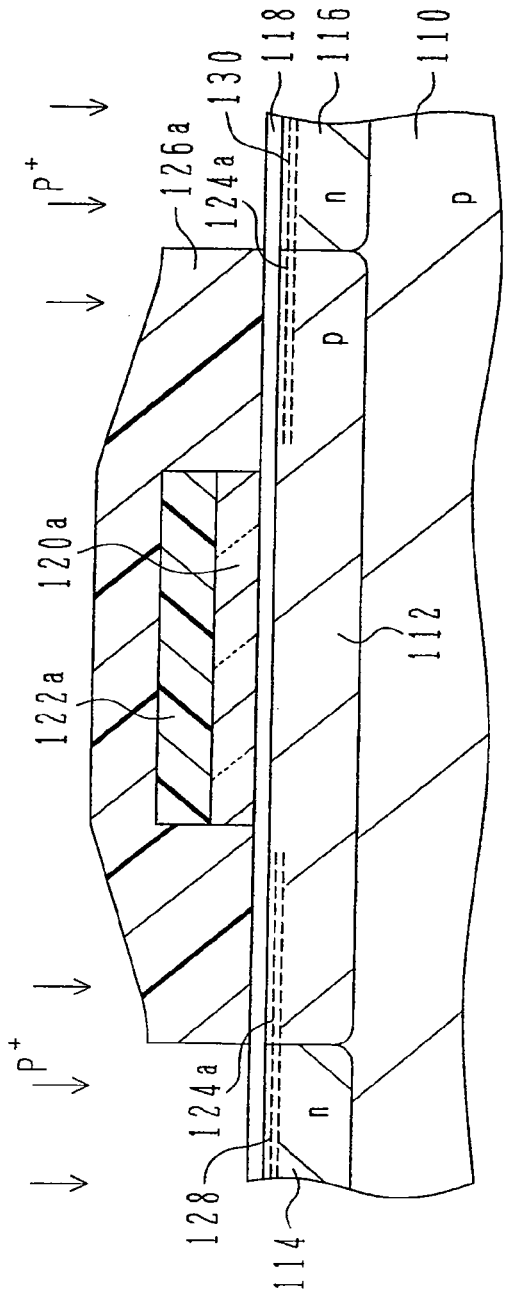

In a process shown in FIG. 3E, a resist layer 126a is formed on the silicon oxide film 118 by a photolithography process, covering the oxidation mask 120a, resist layer 122a and p-type well region 112 and not covering the n-type well regions 114 and 116. Since the resist layer 126a is used as an ion implantation mask in a subsequent ion implantation process, a thickness thereof may be about 900 nm to 1500 nm (preferably about 1100 nm). Since the resist layer 122a was subjected to a curing process in the process shown in FIG. 3A, the resist layer 126a can be formed being stacked on the resist layer 122a.

Next, by using the resist layer 126a as a mask, n-type impurity ions are implanted into the surface layers of the n-type well regions 114 and 116 via the silicon oxide film 118 to form channel stopper ion doped regions 128 and 130 in the n-type well regions 114 and 116, respectively. The ion doped regions 128 and 130 are both formed to have a closed loop pattern. The ion doped region 130 will be detailed later with reference to FIG. 6E, as a representative. For example, this ion implantation is performed by implanting phosphorus ions $P^+$ under the conditions of an acceleration energy of 50 keV and a dose of $4.8 \times 10^{12}$ cm$^2$. A portion 124a of the ion doped region 124 is left in the p-type well region 112. If the channel stopper region (impurity doped region) for a p-channel MOS transistor is not necessary in the n-type well regions 114 and 116, the resist layer forming process and ion implantation process shown in FIG. 3E are omitted.

Figure 3F:
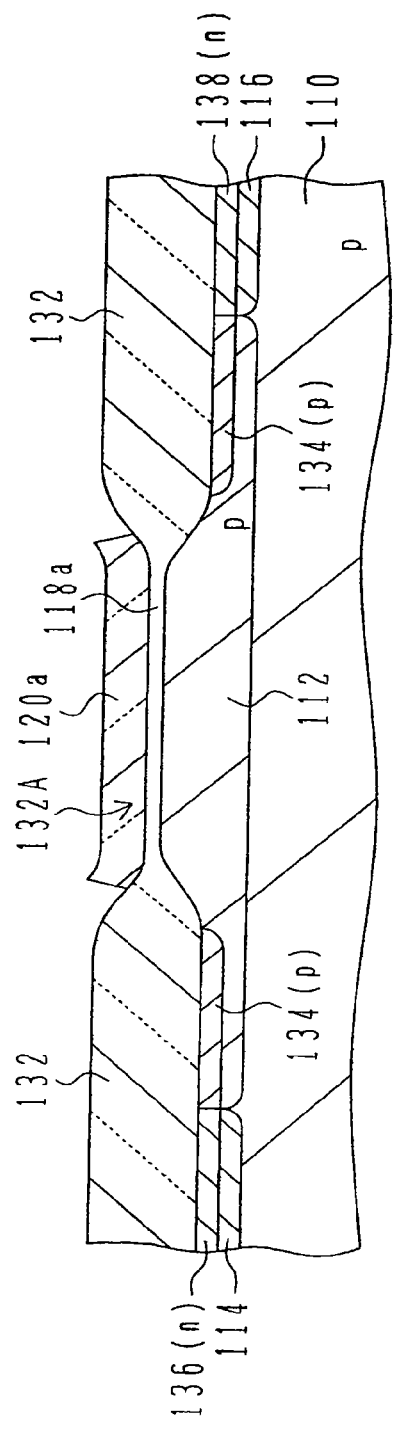

Next, in a process shown in FIG. 3F, the resist layers 126a and 122a are removed by $O_2$ or $O_3$ ashing. Chemical processing using sulfuric acid+hydrogen peroxide and pure water processing are sequentially performed, and then drying is performed. Thereafter, a field oxide film 132 having a device opening 132A on the surface of the substrate 110 is formed through selective oxidation using the oxidation mask 120a. A portion 118a of the silicon oxide film 118 is left on the bottom of the oxidation mask 120a. With this heat treatment, a p-type channel stopper region 134 corresponding to the ion doped region 124a is formed just under the field oxide film 132 and spaced apart from the device opening 132A, whereas n-type channel stopper regions 136 and 138 corresponding to the ion doped regions 128 and 130 are formed in the n-type well regions 114 and 116 just under the field oxide film 132. For example, for selective oxidation, wet thermal oxidation may be performed at a temperature of 1000° C. using a lateral diffusion furnace, and a silicon oxide film having a thickness of 350 nm to 1000 nm (preferably 400 nm to 600 nm, more preferably 500 nm) can be formed as the field oxide film 132.

In a process shown in FIG. 3G, the oxidation mask (silicon nitride film) 120a and silicon oxide film 118a are sequentially removed. The oxidation mask 120a can be removed by wet etching for about 60 minutes using hot phosphoric acid at a temperature of 160° C., and the silicon oxide film 18a can be removed by wet etching using buffered hydrofluoric acid.

On the silicon surface with the silicon oxide film 118a in the device opening 132A being removed, a silicon oxide film having a thickness of 30 nm to 50 nm is formed as a sacrificial oxide film by thermal oxidation. Thermal oxidation can be performed at a temperature of 950° C. in dry $O_2$ (or dry air). After the silicon oxide film as the sacrificial oxide film is removed by using hydrofluoric acid, a silicon oxide film as a gate insulating film 140A is formed on the silicon surface in the device opening 132A by thermal oxidation. Thermal oxidation can be performed at a temperature of 950° C. in dry O$_2$. A thickness of the silicon oxide film as the gate insulating film 140A may be 6.5 nm to 35 nm (preferably 12 nm to 20 nm, more preferably 15 nm).

The gate insulating film 140A is not limited to a single layer silicon oxide film formed in the above manner, but it may be a lamination of a silicon oxide film and a silicon nitride film (or silicon oxynitride film) stacked on the silicon oxide film, a lamination of a tantalum oxide film (or high dielectric constant film) and a silicon oxide film or a silicon nitride film (or silicon oxynitride film, or a sandwich structure having a silicon nitride film (or silicon oxynitride film) or a high dielectric constant film) intervened between two silicon oxide layers.

In a process shown in FIG. 3H, after a gate electrode material layer such as doped polysilicon is deposited on the substrate upper surface, the gate electrode material layer is patterned by photolithography and dry etching to form a gate electrode layer 142A on the gate insulating film 140A. By using as the mask the field oxide film 132 and gate electrode layer 142A, n-type impurity ions such as phosphorus ions are implanted into the surface layer of the p-type well region 112 and annealed to activate implanted impurity ions to form n$^+$-type source/drain regions 144A and 146A. An n-channel MOS type transistor is therefore formed in the device opening 132A.

The following Table 2 shows a relation between an etching amount Δt (nm) in the resist etching process shown in FIG. 3C and a junction breakdown voltage (V) of a drain pn junction between the n$^+$-type drain region 146A and p-type well region 112 shown in FIG. 3H. In Table 2, "MAX" indicates a maximum value, "MIN" indicates a minimum value and "AVG" indicates an average value.

TABLE 2

| Etching amount (nm) | Junction breakdown voltage (V) | | |
| --- | --- | --- | --- |
| | AVG | MAX | MIN |
| 0 | 17.1 | 17.5 | 16.9 |
| 149.8 | 21.5 | 21.8 | 21.2 |
| 250.2 | 24.2 | 24.5 | 23.8 |
| 340.1 | 24.5 | 24.6 | 24 |

Figure 5:
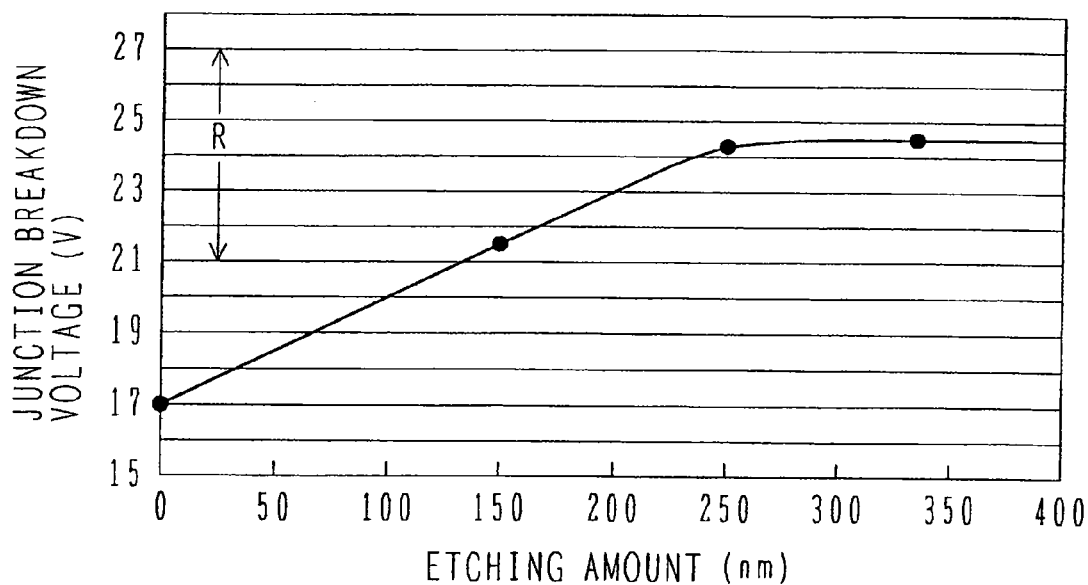
FIG. 5 is a graph showing a relation between a resist etching amount and a drain junction breakdown voltage.

FIG. 5 is a graph showing the relation between the etching amount Δt and junction breakdown voltage (V) shown in Table 2. In FIG. 5, "R" indicates an allowable junction breakdown voltage range of 21 V to 27 V. It can be understood from FIG. 5 that a good junction breakdown voltage can be obtained by setting the etching amount Δt in a range equal to or larger than 150 nm.

According to the above-described field oxide film forming method, since the channel stopper region 134 is formed just under the field oxide film 132 and spaced apart from the device opening 132A as shown in FIG. 3F, a sufficient distance ΔL can be maintained between the source/drain regions 144A and 146A and the channel stopper region 134 as shown in FIG. 3H, so that it is possible to realize improvement on the junction breakdown voltage and reduction in the junction capacitance. Since the channel width will not be narrowed by the channel stopper region 134, it is possible to prevent deterioration (an increase in a threshold voltage and a reduction in a drain current) of the transistor characteristics to be caused by the narrow channel effect. Moreover, since the resist layer 122a is used as a mask in the ion implantation process shown in FIG. 3B, it is not necessary to use a process of forming various insulating films, side spacers and the like, resulting in a small number of processes, improvement on manufacture yield and cost reduction.

FIGS. 6A to 6H illustrate a manufacture method for a p-channel MOS type transistor of the CMOS type IC described with reference to FIGS. 3A to 3H. In FIG. 6A to 6H, like elements to those shown in FIGS. 3A to 3H are represented by using identical numerals and symbols and the detailed description thereof is omitted.

In a process shown in FIG. 6A, by applying the process of forming the p-type well 112 described with reference to FIG. 3A, a p-type well region 113 is formed on the principal surface of the p-type silicon substrate 110, being juxtaposed with the n-type well region 116. The silicon oxide film 118 and silicon nitride film 120 are formed by the thermal oxidation and CVD described with reference to FIG. 3A. By applying the process of forming the resist layer 122a described with reference to FIG. 3A, a resist layer 122b corresponding to a desired device opening pattern is formed on the silicon nitride film 120.

In a process shown in FIG. 6B, the ion implantation process described with reference to FIG. 3B is executed. In this ion implantation process, by using as a mask the resist layer 122b together with the resist layer 122a, an ion doped region 124 containing p-type impurity ions is formed in a peripheral area of the resist layer 122b in a closed loop shape.

In a process shown in FIG. 6C, by applying the isotropic etching described with reference to FIG. 3C, a thickness and planar size of the resist layer 122b are reduced by a predetermined amount Δt. Therefore, the edge position of the resist layer 122b is retracted from the inner end of the ion doped region 124 by an amount corresponding to the etching amount Δt. In a process shown in FIG. 6D, the anisotropic dry etching described with reference to FIG. 3D is executed. In this dry etching, by using as a mask the resist layer 122b together with the resist layer 122a, an oxidation mask 120b made of a remaining portion of the silicon nitride film 120 is formed also on the bottom of the resist layer 122b. Although a portion of the silicon oxide film 118 not covered with the oxidation mask 120b may be removed, it may be left in a manner similar to that described with reference to FIG. 3D.

In a process shown in FIG. 6E, by applying the process of forming the resist layer 126a described with reference to FIG. 3E, resist layers 126b and 126c are formed. The resist layer 126b is formed covering the side of the oxidation mask 120b and the resist layer 122b and not covering an ion doped region (refer to FIG. 6D) existing in the n-type well region 116 as a portion of the ion doped region 124 (in order for ions to be implanted in the next process into the n-type well region 116 including the partial ion doped region). The resist layer 126c is formed covering the p-type well region 113.

Next, the process of implanting n-type impurity ions described with reference to FIG. 3E is executed. In this ion implantation process, by using as a mask the resist layers 126b and 126c together with the resist layer 126a, a channel stopper ion doped region 130 containing n-type impurity ions is formed in a peripheral area of the resist layer 126b. Therefore, the ion doped region 130 is formed in the peripheral area of the resist layer 126b by compensating for the ion doped region existing in the n-type well region 116 as a portion of the ion doped region 124, as shown in FIG. 6D. A portion 124c of the ion doped region 124 is left in the p-type well region 113.

In a process shown in FIG. 6F, by applying the process of removing the resist layers 126a and 122a described with reference to FIG. 3F, the resist layers 126b, 126c and 122b are removed. The chemical processing using sulfuric acid+hydrogen peroxide, pure water processing and drying described with reference to FIG. 3F are sequentially performed. Thereafter, selective oxidation described with reference to FIG. 3F is performed. The selective oxidation uses the oxidation mask 120b together with the oxidation mask 120a to form the field oxide film 132, on the surface of the substrate 110, having device openings 132A and 132B corresponding to the oxidation masks 120a and 120b. A portion 118b of the silicon oxide film 118 is left on the bottom of the oxidation mask 120b. With this heat treatment, the p-type channel stopper region 134 is formed in a manner similar to that described with reference to FIG. 3F, and an n-type channel stopper region 138 corresponding to the ion doped region 130 is formed just under the field oxide film 132 and spaced apart from the device opening 132B, as shown in FIG. 6F. In the p-type well region 113, a p-type channel stopper region 139 corresponding to the ion doped region 124c is formed just under the field oxide film 132.

In a process shown in FIG. 6G, by applying the process of removing the oxidation mask 120a and silicon oxide film 118a described with reference to FIG. 3G, the oxidation mask 120b and silicon oxide film 118a are removed. By applying the thermal oxidation and hydrofluoric acid processing described with reference to FIG. 3G, a sacrificial film is formed and then removed. Thereafter, by applying a process of forming the gate insulating film described with reference to FIG. 3G or by using an independent process, a gate insulating film 140B is formed in the device opening 132B.

In a process shown in FIG. 6H, after the gate electrode material layer such as doped polysilicon is deposited on the substrate upper surface, the gate electrode material layer is patterned by photolithography and dry etching to form a gate electrode layer 142B on the gate insulating film 140B. By using as the mask the field oxide film 132 and gate electrode layer 142B, p-type impurity ions such as $BF_2$ ions are implanted into the surface layer of the n-type well region 116 and annealed to activate implanted impurity ions to form $p^+$-type source/drain regions 144B and 146B. A p-channel MOS type transistor is therefore formed in the device opening 132B.

Figure 6A:
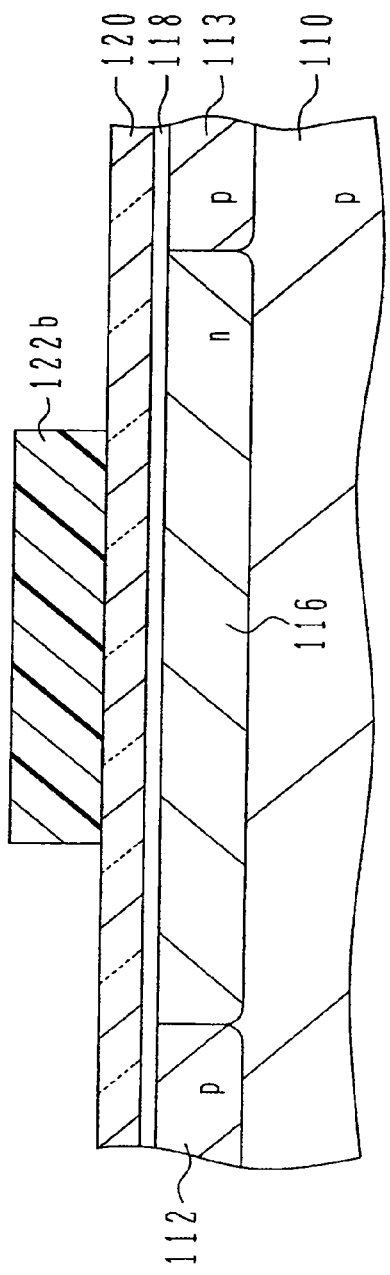
Figure 6B:
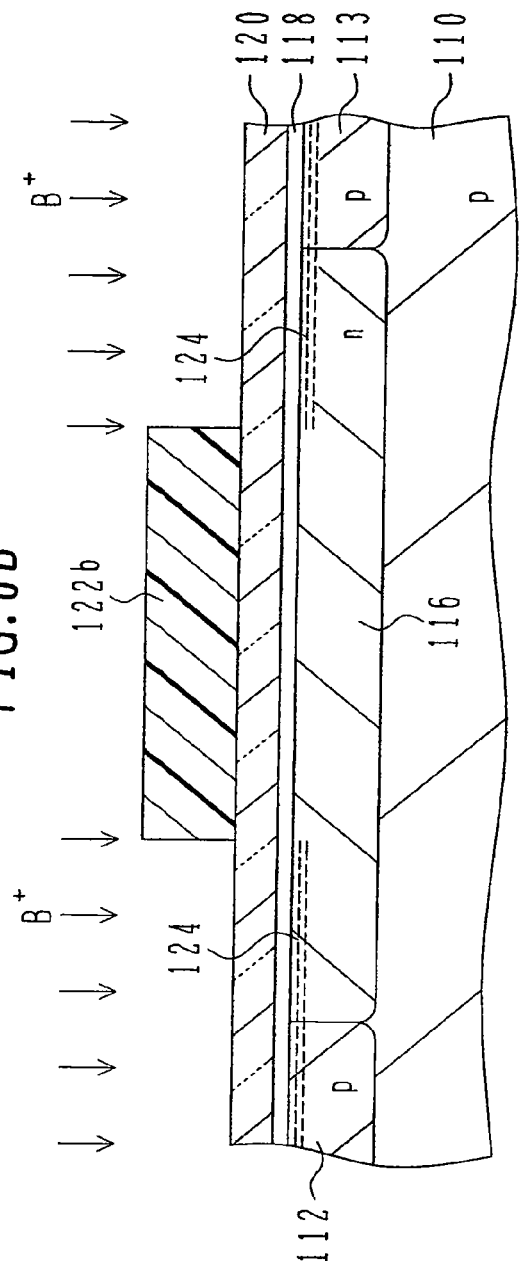
Figure 7A:
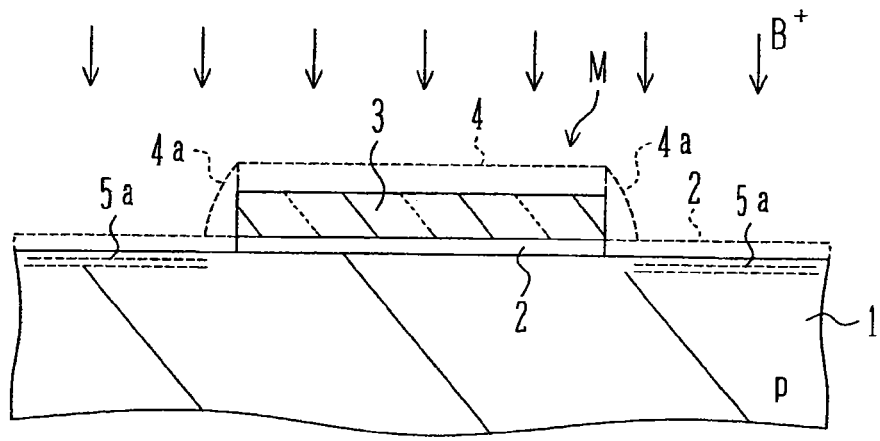
FIGS. 7A to 7C are cross sectional views illustrating an example of a conventional field oxide film forming method.
Figure 7B:
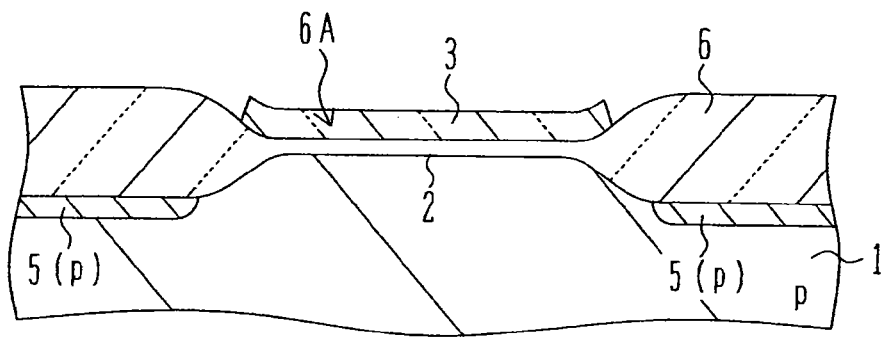
Figure 7C:
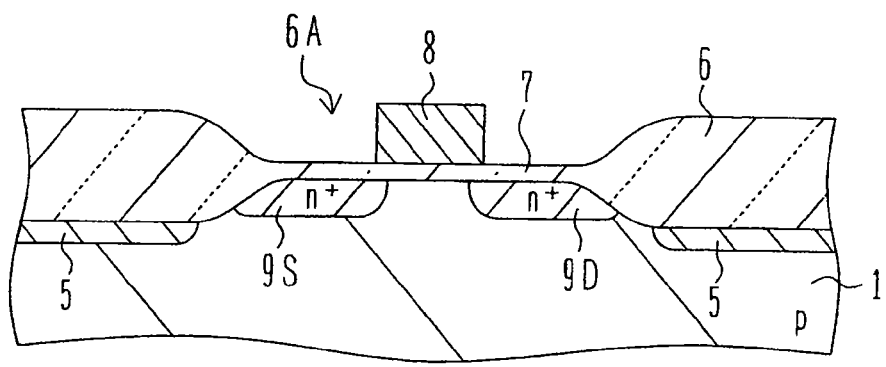
Figure 8A:
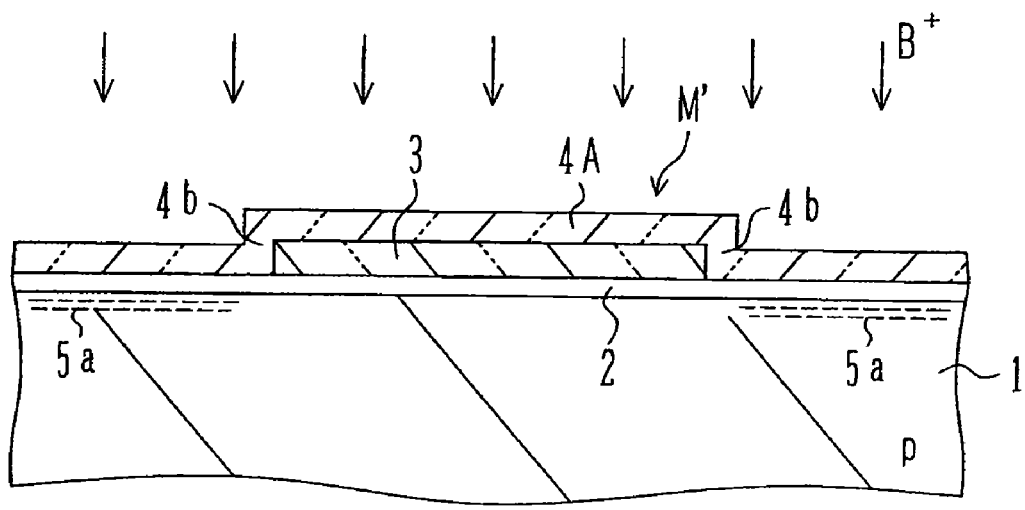
FIGS. 8A and 8B are cross sectional views illustrating another example of a conventional field oxide film forming method.
Figure 8B:
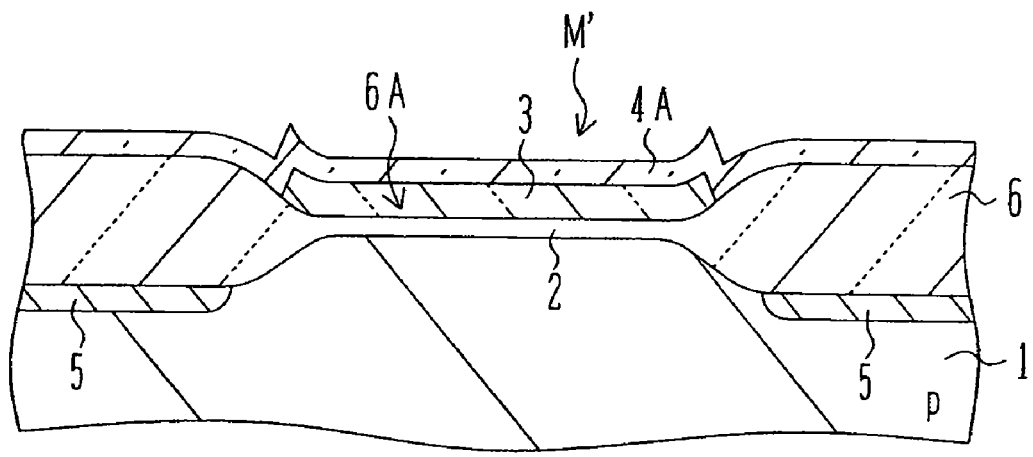
Figure 9A:
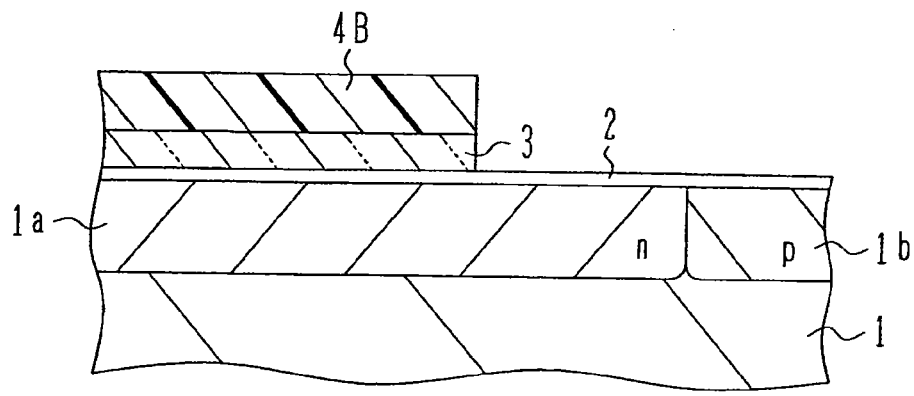
FIGS. 9A to 9C are cross sectional views illustrating still another example of a conventional field oxide film forming method.
Figure 9B:
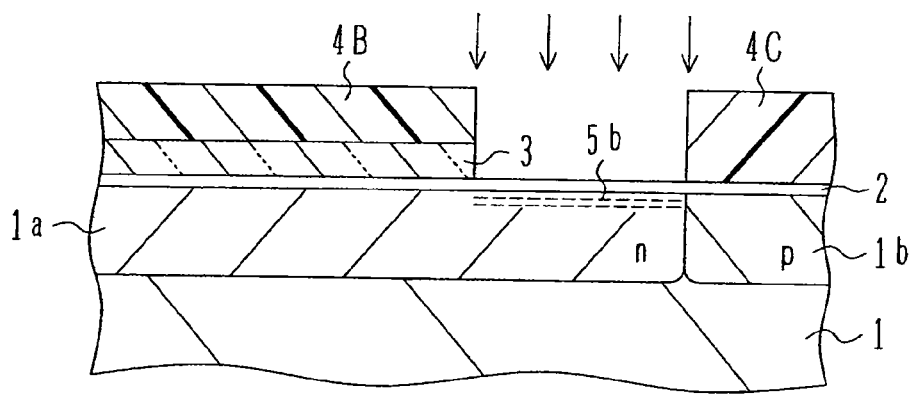
Figure 9C:
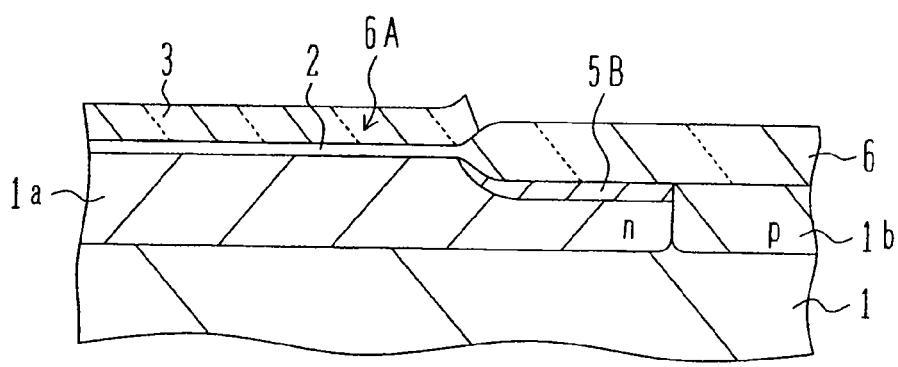

According to the field oxide film forming method described with reference to FIGS. 6A to 6H, since the channel stopper region 138 is formed just under the field oxide film 132 and spaced apart from the device opening 132B as shown in FIG. 6F, a sufficient distance ΔL can be maintained between the source/drain regions 144B and 146B and the channel stopper region 138 as shown in FIG. 6H, so that it is possible to realize improvement on the junction breakdown voltage and reduction in the junction capacitance. Since the channel width will not be narrowed by the channel stopper region 138, it is possible to prevent deterioration (an increase in a threshold voltage and a reduction in a drain current) of the transistor characteristics to be caused by the narrow channel effect. Moreover, only the process of forming the resist layer and the ion implantation process shown in FIG. 6E are additionally used as the dedicated process of forming the n-type well region 116, so that an increase in the number of processes can be suppressed, resulting in improvement on a manufacture yield and cost reduction.

The structure and manufacture method for MOS type transistors are not limited to those described above, but various well-known structures and manufacture methods can also be used. Not only MOS type transistors but also circuit elements such as MOS type capacitors and resistor elements can be formed in the device openings.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device manufacture method comprising steps of:
   (a) preparing a silicon substrate having a principal surface and one conductivity type at least in a device forming region;
   (b) forming an oxidation mask material layer covering said device forming region on the principal surface of said silicon substrate;
   (c) forming a first resist layer on said oxidation mask material layer in accordance with a first device opening pattern corresponding to a portion of said device forming region;
   (d) forming a first ion doped region for a channel stopper by implanting impurity ions of said one conductivity type into the principal surface of said silicon substrate via said oxidation mask material layer by using said first resist layer as a mask;
   (e) after said first ion doped region is formed, isotropically etching said first resist layer to reduce a thickness and a planar size of said first resist layer by a predetermined amount;
   (f) after said isotropical etching, patterning said oxidation mask material layer by etching using said first resist layer as a mask to form a first oxidation mask made of a remaining portion of said oxidation mask material layer; and
   (g) after said first resist layer is removed, forming a field oxide film having a device opening corresponding to said first oxidation mask on the principal surface of said silicon substrate through selective oxidation using said first oxidation mask and forming a first channel stopper region of said one conductivity type corresponding to said first ion doped region, wherein:
   a well region of a conductivity type opposite to said one conductivity type is formed on the principal surface of said silicon substrate;
   said step (b) forms said oxidation mask material layer covering also said well region;
   said step (c) forms also a second resist layer in accordance with a second device opening pattern corresponding to a portion of said well region;
   said step (d) forms said first ion doped region using said second resist layer also as a mask;
   said step (e) isotropically etches also said second resist layer to reduce a thickness and a planar size of said second resist layer by a predetermined amount;
   said step (f) patterns said oxidation mask material layer using said second resist layer also as a mask to form a second oxidation mask made of the remaining portion of said oxidation mask material layer corresponding to said second resist layer,
   the semiconductor device manufacture method further comprises, after said step (f) and before said step (g), steps of:
   (h) forming a third resist layer covering said device forming region and said first resist layer and forming a fourth resist layer not covering an ion doped region existing in said well region as a portion of said first ion doped region and covering a side of said second oxidation mask and said second resist layer; and (i) implanting impurity ions of said conductivity type opposite to said one conductivity type into said well region by using as a mask said third and fourth resist layers to form a second ion doped region for a channel stopper by compensating for the ion doped region existing in said well region as a portion of said first ion doped region;

after said third and fourth resist layers and said first and second resist layers are removed, said step (g) forms a field oxide film having first and second device openings corresponding to said first and second oxidation masks on the principal surface of said silicon substrate through selective oxidation using said first and second oxidation masks, a first channel stopper region having said one conductivity type and corresponding to the first ion doped region and a second channel stopper region having said conductivity type opposite to said one conductivity type and corresponding to the second ion doped region.

2. A semiconductor device manufacture method comprising steps of:

preparing a silicon substrate having a principal surface and a device forming region of one conductivity type and a well region of an opposite conductivity type opposite to said one conductivity type;

forming an oxidation mask material layer covering said device forming region and said well region on the principal surface of said silicon substrate;

forming first and second resist layers on said oxidation mask material layer in accordance with a first device opening pattern corresponding to a portion of said device forming region and a second device opening pattern corresponding to a portion of said well region;

forming a first ion doped region for a channel stopper by implanting impurity ions of said one conductivity type into the principal surface of said silicon substrate via said oxidation mask material layer by using said first and second resist layers as a mask;

after said first ion doped region is formed, isotropically etching said first and second resist layers to reduce a thickness and a planar size of said first and second resist layers by a predetermined amount;

forming a third resist layer covering said device forming region and said first resist layer, and forming a fourth resist layer not covering an ion doped region existing in said well region as a portion of said first ion doped region and covering a side of said second oxidation mask and said second resist layer;

implanting impurity ions of said opposite conductivity type into said well region by using as a mask said third and fourth resist layers to form a second ion doped region for a channel stopper by compensating for the ion doped region existing in said well region as a portion of said first ion doped region;

after said third and fourth resist layers and said first and second resist layers are removed, forming a field oxide film having first and second device openings corresponding to said first and second oxidation masks on the principal surface of said silicon substrate through selective oxidation using said first and second oxidation masks, a first channel stopper region having said one conductivity type and corresponding to the first ion doped region and a second channel stopper region having said opposite conductivity type and corresponding to the second ion doped region.

* * * * *